(12) United States Patent
Kamata et al.

(10) Patent No.: US 8,431,920 B2
(45) Date of Patent: Apr. 30, 2013

(54) INFORMATION RECORDING AND REPRODUCING DEVICE FOR HIGH-RECORDING DENSITY

(75) Inventors: Chikayoshi Kamata, Kawasaki (JP); Takayuki Tsukamoto, Kawasaki (JP); Takeshi Yamaguchi, Kawasaki (JP); Tsukasa Nakai, Hino (JP); Takahiro Hirai, Yokohama (JP); Shinya Aoki, Yokohama (JP); Kohichi Kubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 263 days.

(21) Appl. No.: 12/884,880

(22) Filed: Sep. 17, 2010

(65) Prior Publication Data

US 2011/0062407 A1 Mar. 17, 2011

Related U.S. Application Data

(63) Continuation of application No. PCT/JP2008/056499, filed on Apr. 1, 2008.

(51) Int. Cl.
*H01L 47/00* (2006.01)

(52) U.S. Cl.
USPC ............................... 257/4; 257/655; 365/148

(58) Field of Classification Search .................. None
See application file for complete search history.

(56) References Cited

U.S. PATENT DOCUMENTS

| | | | | | |
|---|---|---|---|---|---|
| 5,825,046 | A | * | 10/1998 | Czubatyj et al. | ................ 257/2 |
| 2006/0104106 | A1 | * | 5/2006 | Aratani et al. | ................ 365/148 |
| 2007/0133358 | A1 | * | 6/2007 | Kubo et al. | ................ 369/13.38 |
| 2007/0196696 | A1 | * | 8/2007 | Osano et al. | ................ 428/811.4 |
| 2007/0285969 | A1 | * | 12/2007 | Toda et al. | ................ 365/148 |

FOREIGN PATENT DOCUMENTS

| JP | 2002-362923 | 12/2002 |
|---|---|---|
| JP | 2006-140412 | 6/2006 |
| WO | WO 2005/101420 A1 | 10/2005 |

OTHER PUBLICATIONS

English Translation of International Preliminary Report on Patentability and Written Opinion of the International Searching Authority issued Dec. 9, 2010, in Patent Application No. PCT/JP2008/056499.
Office Action issued Mar. 8, 2011, in Japanese Patent Application No. 2010-505229 with English translation.

(Continued)

*Primary Examiner* — Evan Pert
*Assistant Examiner* — Andres Munoz
(74) *Attorney, Agent, or Firm* — Oblon, Spivak, McClelland, Maier & Neustadt, L.L.P.

(57) ABSTRACT

According to one embodiment, an information recording and reproducing device includes a recording layer which includes a typical element and a transition element, and stores a state of a first electric resistivity and a state of a second electric resistivity different from the first electric resistivity by a movement of the typical element, and an electrode layer which is disposed at one end of the recording layer to apply a voltage or a current to the recording layer. The recording layer includes a first region which is in contact with the electrode layer and the electrode layer includes a second region which is in contact with the recording layer. The first and second regions are opposite to each other. And the first and second regions include the typical element, and a concentration of the typical element in the second region is higher than that in the first region.

10 Claims, 19 Drawing Sheets

OTHER PUBLICATIONS

Tamihiro Gotoh et al., Minimal Phase-Change Marks Produced in Amorphous $Ge_2Sb_2Te_5$ Films, Japanese Journal of Applied Physics, vol. 43, No. 6B, 2004, pp. L818-L821.

A. Sawa et al., Hysteretic current-voltage characteristics and resistance switching at a rectifying $Ti/Pr_{0.7}Ca_{0.3}MnO_3$ interface, Applied Physics Letters, vol. 85, No. 18 Nov. 1, 2004, pp. 4073-4075.

P. Vettiger et al., The "Millipede"—Nanotechnology Entering Data Storage, IEEE Transactions on Nanotechnology, vol. 1, No. 1, Mar. 2002, pp. 39-55.

P. Vettiger et al., Thousands of Microcantilevers for Highly Parallel and Ultra-dense Data Storage, Technical Digest, IEDM, pp. 03-763-03-766.

T. Sakamoto, et al., "Kotai Denkaishitsu Memory", Oyo Butsuri, 2006, vol. 75, No. 9, pp. 1126-1130.

* cited by examiner

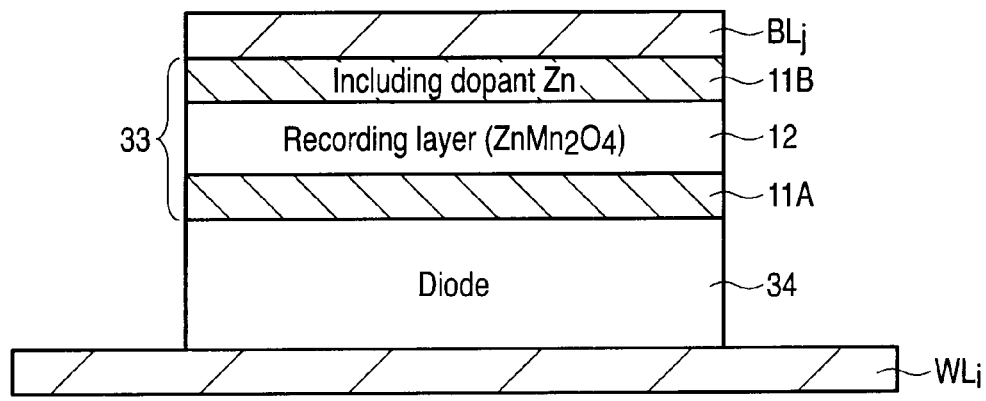
F I G. 16
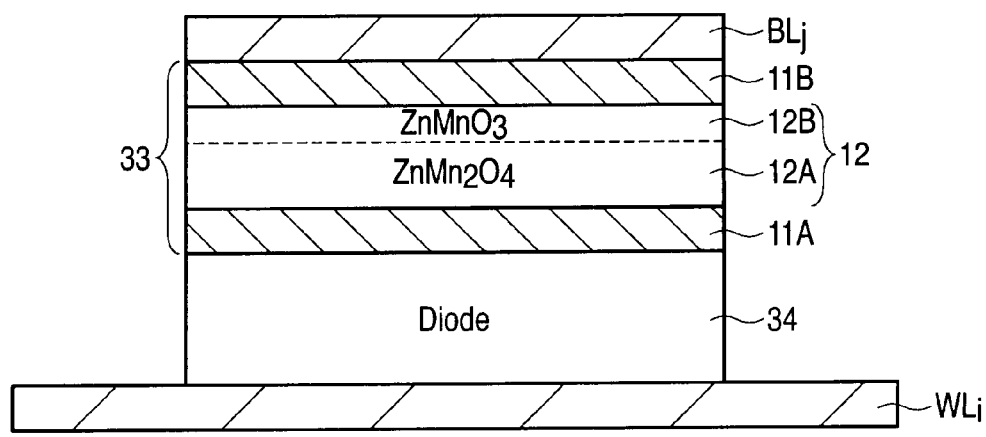
F I G. 17
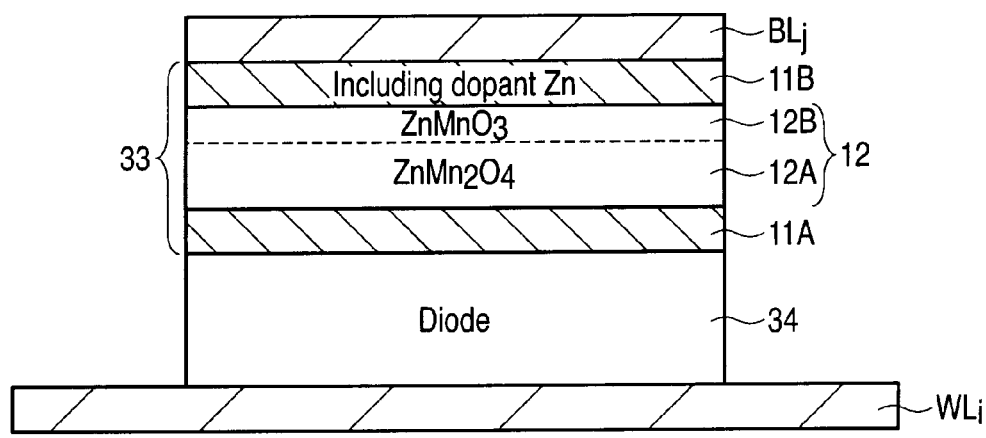
F I G. 18

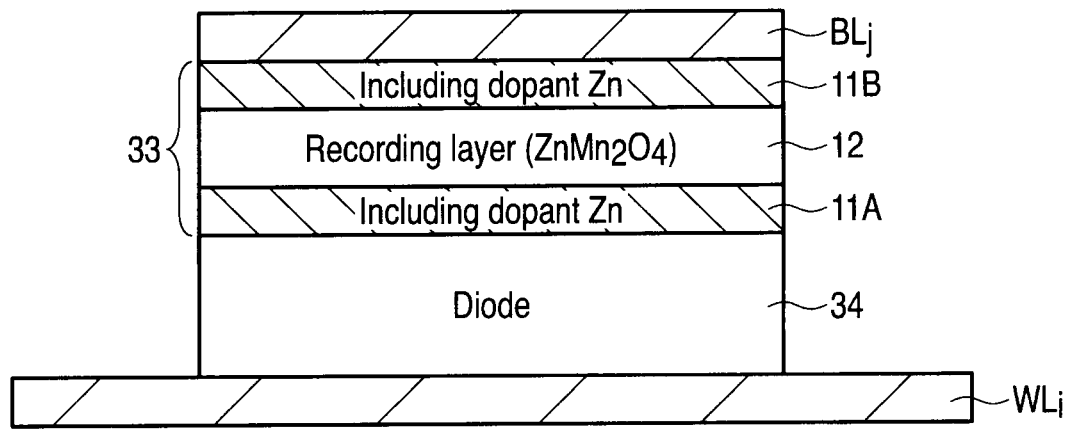
F I G. 19
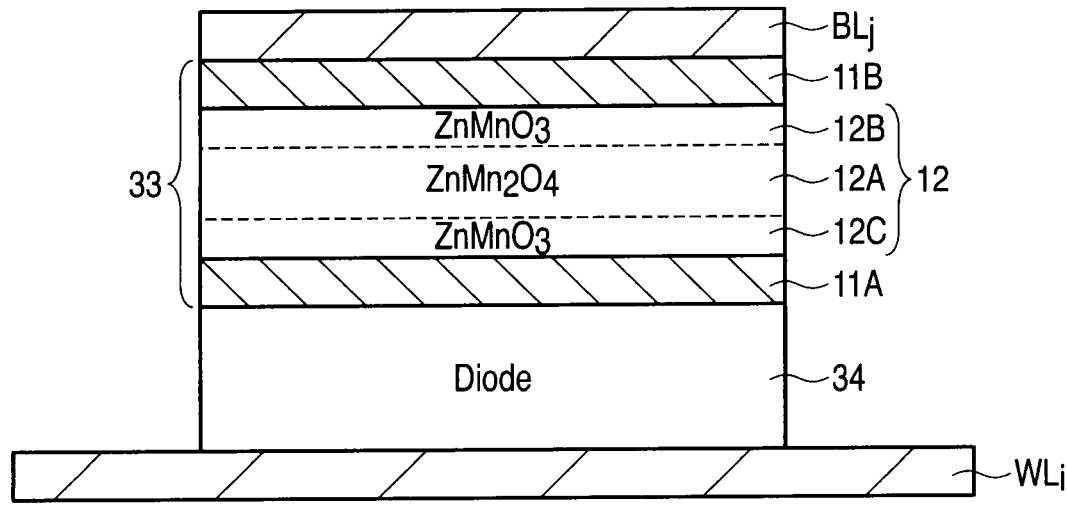
F I G. 20

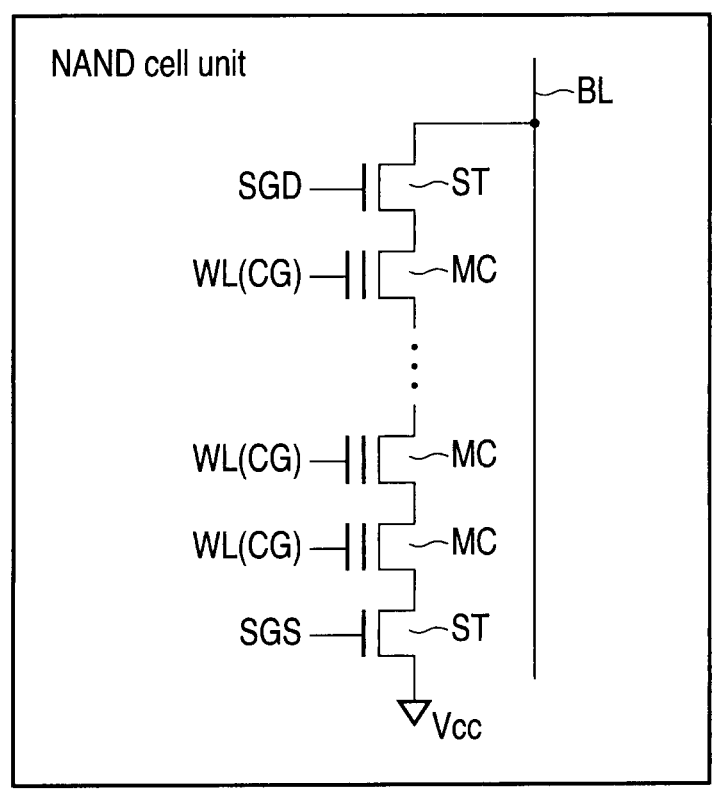
F I G. 22

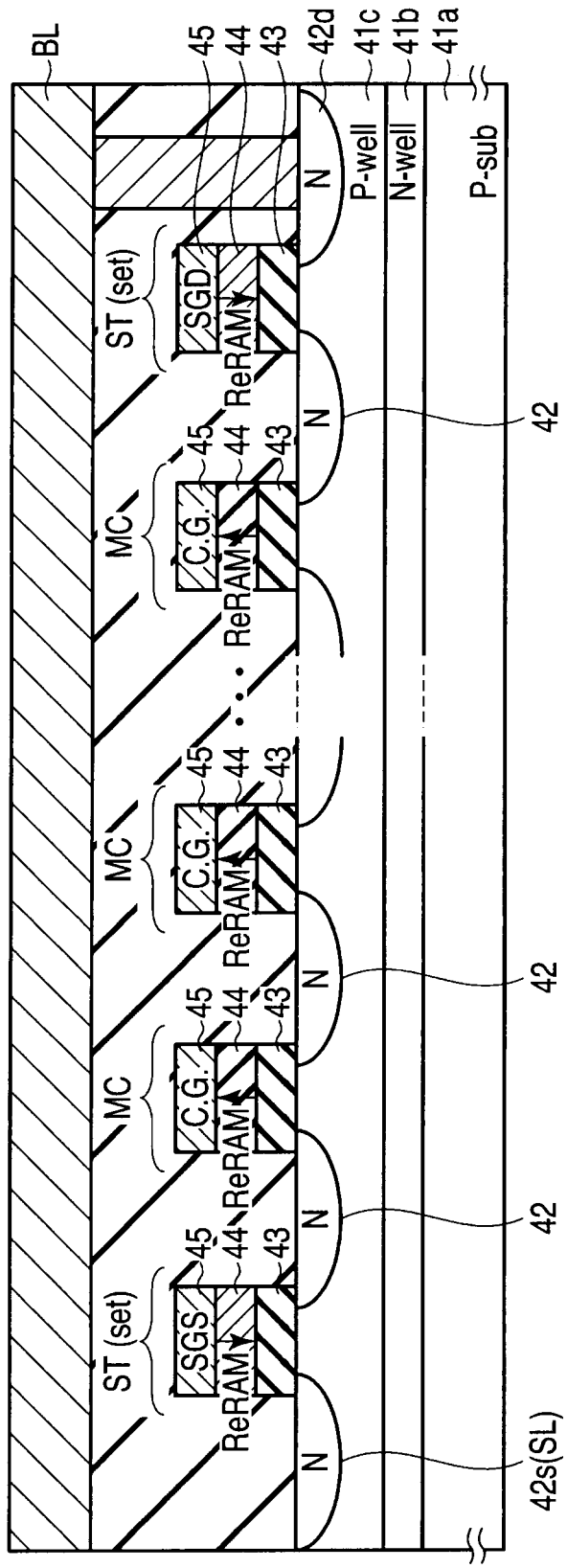
F I G. 23

INFORMATION RECORDING AND REPRODUCING DEVICE FOR HIGH-RECORDING DENSITY

CROSS-REFERENCE TO RELATED APPLICATIONS

This is a Continuation application of PCT Application No. PCT/JP2008/056499, filed Apr. 1, 2008, which was published under PCT Article 21(2) in Japanese.

FIELD

The present invention relates to a high-recording-density information recording and reproducing device.

BACKGROUND

Recently, compact mobile devices are put to practical use toward the realization of a ubiquitous society, and demands for a compact, large-capacity, nonvolatile memory have been rapidly increasing year by year with the spread of the compact mobile devices. Among the various types of memory, the recording densities of NAND type flash memory and compact HDD (Hard Disk Drive) are rapidly being enhanced in response to the growing market.

However, in both the NAND type flash memory and the compact HDD, a problem of a limit of the recording density will be generated in the near future. Particularly, a limit of tracking accuracy relates to the compact HDD, and an increase of a process cost is generated due to a limit of microfabrication and reduction of a minimum line width in the NAND type flash memory. There is a strong demand for technological development of overcoming the limit of the recording density, and a novel solid-state memory has been proposed in order to considerably exceed the limit of recording density.

Conventionally, a memory in which an ON state (amorphous state) and an OFF state (crystalline state) are used by changing a film state (an amorphous state and a crystalline state) of a recording material called a PRAM (Phase change RAM) is proposed as a novel solid-state memory, and has been developed and is close to practical use (for example, see T. Gotoh et al., Jpn. J. Appl. Phys., 43, 6B, 2004, L818 and A. Sawa, T. Fuji, M. Kawasaki and Y. Tokura, Appl. Phys, Lett., 85, 18, 4073 (2004)).

Recently, research and development of the novel solid-state memory called a RRAM (Resistive RAM) have been promoted, and recording materials such as NiO and CuO are reported. In the RRAM, a voltage pulse is applied to the recording material, a low-resistance state (setting state) and a high-resistance state (resetting state) are repeatedly changed by utilizing a change in resistance of the recording material, and the state is converted into binary data (0 or 1) to record or erase information. One of the features of the RRAM is that the RRAM can be operated in principle even if an element size is reduced to about 10 nm. Because the RRAM can realize a recording density of about 10 Tbpsi (terabytes per square inch), the RRAM is a potential candidate for high recording density.

There is also proposed a MEMS memory in which a MEMS (Microel Ectro Mechanical System) technology is used (for example, see P. Vettiger, G. Cross, M. Despont, U. Drechsler, U. Durig, B. Gotsmann, W. Haberle, M. A. Lants, H. E. Rothuizen, R. Stutz and G. K. Binnig, IEEE Trans. Nanotechnology 1, 39 (2002)). In the MEMS memory, because an interconnection is not required in a recording portion, an extremely high recording density can possibly be realized. Recently, a combination of the MEMS technology and various recording principles has been proposed to study power consumption, recording and reproducing density, and operation speed (for example, see P. Vettiger et al. in Technical Digest, IEDM03 pp. 763-766). However, the novel information recording medium utilizing the resistance-change type recording material mentioned above has not currently been realized. This is attributed to the following facts. That is, the novel information recording medium is largely degraded by repetition of memory switching, thermal stability is low in each resistance state, and a problem of a heat resistance property (process resistance property) of a recording layer/electrode layer is generated by a post-annealing treatment.

BRIEF SUMMARY

One example of the present invention proposes a technology in which a film property of the recording medium is sufficiently secured while the high recording density is realized.

According to one example of the present invention, an information recording and reproducing device includes a recording layer which includes a typical element and a transition element, and stores a state of a first electric resistivity and a state of a second electric resistivity different from the first electric resistivity by a movement of the typical element, and an electrode layer which is disposed at one end of the recording layer to apply a voltage or a current to the recording layer. The recording layer includes a first region which is in contact with the electrode layer and the electrode layer includes a second region which is in contact with the recording layer. The first and second regions are opposite to each other. The first and second regions include the typical element, and a concentration of the typical element in the second region is higher than that in the first region.

Accordingly, the invention can provide the nonvolatile information recording and reproducing device in which the film property of the recording medium is sufficiently secured while the high recording density is realized.

BRIEF DESCRIPTION OF DRAWINGS

FIGS. 16 to 20 are views, each illustrating a structure of a memory cell.
FIG. 22 is a circuit diagram illustrating a NAND cell unit.

FIGS. 23 to 25 are views, each illustrating a structure of a NAND cell unit.

DETAILED DESCRIPTION

Figure 1:
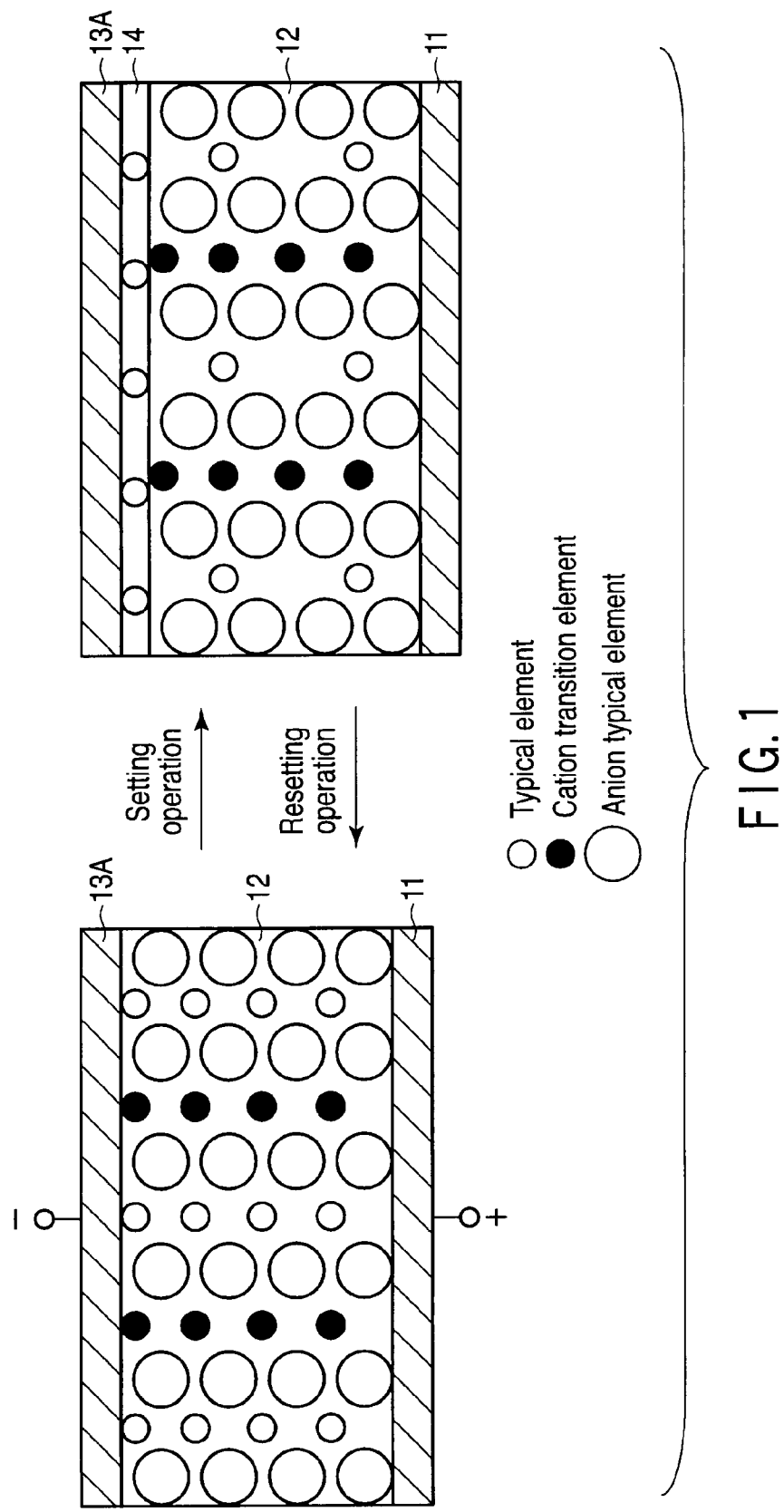
FIG. 1 is a view illustrating a recording principle.

An exemplary embodiment of the invention will be described in detail with reference to the drawings.

1. Outline

In order to put the novel solid-state memory to practical use, it is necessary to develop a recording medium or a recording element that has a good heat resistance property. The good heat resistance property means that a typical element that is a diffusion ion in a recording layer does not diffuse in an electrode layer even if a post-annealing treatment (heat treatment) is performed after the recording medium or the recording element is formed; that is, a concentration of the typical element that is the diffusion ion (typical ion diffusion element) in the recording layer is kept constant before and after the post-annealing treatment.

Therefore, the information recording and reproducing device of the embodiment of the invention includes the recording layer that includes the typical element that is the diffusion ion, wherein at least two different states of an electric resistivity are recorded in the recording layer by movement of the typical element; and the electrode layer that is disposed at one end of the recording layer provides a voltage or a current to the recording layer, wherein the electrode layer includes the typical element as an additive (dopant), and a concentration of the typical element in a region that is in contact with the recording layer is higher than a concentration of the typical element in the recording layer.

Additionally, the information recording and reproducing device of the embodiment of the invention includes the recording layer that includes the typical element that is the diffusion ion, wherein at least two different states of the electric resistivity are recorded in the recording layer by the movement of the typical element; and the electrode layer that is disposed at one end of the recording layer provides the voltage or the current to the recording layer, wherein, in the recording layer, the region that is in contact with the electrode layer differs from other regions in a composition, and the region that is in contact with the electrode layer includes the typical element whose concentration is higher than a concentration of the typical element in other regions.

The above structure is intended to previously include an element, which is identical to the typical element that is the diffusion ion included in the recording layer and has a concentration higher than that of the typical element, in the region of the electrode layer that is in contact with the recording layer or the region of the recording layer that is in contact with the electrode layer, and whereby the regions comprise a diffusion preventing region that prevents the element from diffusing from the recording layer to the electrode layer.

In order to effectively exert a function as the diffusion preventing region, preferably the element that is identical to the typical element that is the diffusion ion included in the recording layer is added up to the saturation state to the region of the electrode layer that is in contact with the recording layer or the region of the recording layer that is in contact with the electrode layer.

As used herein, the concentration of the typical element that is the diffusion ion included in the recording layer means a concentration after the post-annealing treatment (heat treatment) that is performed after the recording medium or recording element is formed. In the embodiment of the invention, the post-annealing treatment aims at the recording medium or recording element in which at least two different states of the electric resistivity are recorded by the movement of the typical element that is the diffusion ion. That is, the concentration of the typical element that is the diffusion ion in the recording layer is considered to dynamically change. Therefore, the concentration of the typical element that is the diffusion ion in the recording layer means the concentration when the recording medium or recording element is in an initial state.

The element, which is identical to the typical element that is the diffusion ion included in the recording layer and has a concentration higher than that of the typical element, is included in the region of the electrode layer that is in contact with the recording layer or the region of the recording layer that is in contact with the electrode layer, which allows the element to be prevented from diffusing from the recording layer to the electrode layer. Therefore, the stability of the switching operation and the thermal stability of the resistance value in the setting/resetting state can be secured by the improvement of the film property.

Preferably, the typical element is an element that is selected from a group comprising of Zn, Cd, Hg, Al, Ga, In, Ti, Be, Mg, and Ca. Preferably, the electrode layer mainly includes an element that is selected from a group comprising of Ti, Zr, Hf, V, Nb, Ta, Cr, Mo, W, Ru, Ni, Pd, Pt, Cu, Ag, and Au. Preferably, the electrode layer has a thickness of 20 nm or less.

For example, the recording layer includes a material expressed by a chemical formula: $A_xM_yX_4$ ($0.1 \leq x \leq 2.2$ and $1.5 \leq y \leq 2$). Here, A is a typical element that is selected from a group comprising of Zn, Cd, and Hg, M is a transition element that is selected from a group comprising of Cu, Mo, W, Mn, Tc, Re, and Fe, and X is an element that is selected from a group comprising of O and N.

Preferably, the recording layer has a crystal structure that is selected from a group comprising of a spinel structure, an ilmenite structure, a wolframite structure, and a delafossite structure. Preferably, the recording layer has a thickness of 50 nm or less.

For example, the post-annealing treatment is performed at a temperature of 600° C. in a nitrogen atmosphere.

2. Basic Principle

A basic principle of the recording operation of the recording layer used in the invention will be described.

In the following description, it is assumed that the recording layer takes one of two states having different electric resistivities. A system in which two kinds of ions exist will be described.

It is assumed that, in an initial state, the recording layer becomes an insulator (high-resistance state) having the electric resistivity of, for example, $10^7$ Ω·cm. Some cation elements existing in the recording layer move onto a cathode (negative electrode) side by providing a potential difference at both ends of the recording layer.

As a result, when the recording layer is positioned on an anode (positive electrode) side while a conductive oxide layer is positioned on the cathode side, the cation elements emitted from the recording layer are introduced into the conductive oxide layer, and a proportion of the cation element becomes relatively larger than a proportion of the anion element in the conductive oxide layer.

At the same time, the conductive oxide layer receives electrons from the cathode in order to maintain electric neutrality, and a valence of the transition element decreases in the conductive oxide layer, which results in a compound having a low oxidation state.

Because the proportion of the cation element becomes relatively smaller than the proportion of the anion element in the recording layer on the anode side, electrons are emitted to the cation, which results in the compound having the high oxidation state.

Therefore, the recording layer takes the low-resistance state having the electric resistivity of, for example, $10^3$ $\Omega$·cm.

This is the setting operation.

When a current is provided to the recording layer in the low-resistance state, a large current is passed through the recording layer due to the low resistance even with the low potential difference, and Joule heat generated at that time raises the temperature of the recording layer.

The recording layer returns from a high-energy metastable state raised by the setting operation to the insulator (high-resistance state) that is in a low-energy stable state of that before the setting operation.

This is the resetting operation.

Regarding the change in resistance of the recording layer, preferably the electric resistivity of the conductive oxide layer does not change. However, when the electric resistivity of the conductive oxide layer is set sufficiently smaller than the minimum value of the electric resistivity of the conductive oxide layer, no problem is generated even if the electric resistivity of the conductive oxide layer changes.

The information recording and reproducing device according to the invention including the conductive oxide layer can realize a Pbpsi (Peta bit per square inch) class in principle and significant improvement of a write disturb resistance property.

3. Basic Structure

FIG. 1 illustrates a structure of a recording portion based on the invention. Reference numeral 11 denotes an electrode layer, reference numeral 12 denotes a recording layer, reference numeral 13A denotes an electrode layer (or a protective layer), and reference numeral 14 denotes a metallic layer. A large white circle indicates an anion typical element (oxygen ion), a small black circle indicates a cation transition element (base cation) Y, and a small white circle indicates a typical element (cation) X as the diffusion ion.

For example, the recording layer 12 is made of $ZnMn_2O_4$ having a spinel structure, Zn corresponds to the typical element as the diffusion ion, Mn corresponds to the cation transition element, and O corresponds to the anion typical element.

Some cations X move into the crystal when a voltage is applied to the recording layer 12 to generate a potential gradient in the recording layer 12. In the embodiment of the invention, the recording layer 12 is set to the insulator (high-resistance-state phase), and the phase change of the recording layer 12 is generated by the potential gradient to provide the conductivity to the recording layer 12 (low-resistance-state phase), thereby recording information. For example, the state in which a potential at the electrode layer 13A is relatively lower than a potential at the electrode layer 11 is formed. A negative potential may be provided to the electrode layer 13A when the electrode layer 11 is set to a fixed potential (for example, ground potential).

At this point, some cations X in the recording layer 12 move onto the side of the electrode layer (cathode) 13A, and the number of cations X in the recording layer (crystal) 12 decreases relative to the number of oxygen ions. The cations X that move onto the side of the electrode layer 13A receives electrons from the electrode layer 13A to be deposited in the form of X atoms that are a metal, thereby forming the metallic layer 14.

In the recording layer 12, the oxygen ions become excessive to raise the valences of the cations Y that are left without diffusion. At this point, when the cation X is selected such that an electric resistance decreases when the valence is raised, because the electric resistance decreases by the movement of the cation X in both the metallic layer 14 and the recording layer 12, the phase of the whole recording layer 12 is changed to the low-resistance-state phase, and therefore, information recording (setting operation) is completed.

The recording layer 12 including the metallic layer 14 is subjected to the joule heating by a large current pulse to promote a redox reaction of the recording layer 12. After the large current pulse is cut off, some X atoms in the metallic layer 14 emit their electrons to the electrode layer 13A by the residual heat, and the X atoms are disposed as the cations X in a vacant site in the crystals of the recording layer 12. Therefore, the recording layer 12 changes to the insulator (resetting operation).

In the embodiment of the invention, the initial states of the recording layer 12 and the metallic layer 14 are set to a conductor (low-resistance-state phase), and the phase of the recording layer 12 is changed by the Joule heating using the large current pulse to provide the insulating property to the recording layer 12 (high-resistance-state phase).

Because the cation X invades the recording layer 12, the oxygen ion becomes a deficit state to decrease the valence of the cation Y in the recording layer 12.

The above-described procedure is a kind of electrolysis, and it can be considered that an oxidation agent is generated by electrochemical oxidation on the side of the electrode layer (anode) 11 while a reducing agent is generated by electrochemical reduction on the electrode layer (cathode) 13A.

In order to put the operation principle to practical use, it is necessary to confirm that the resetting operation is not generated at room temperature (securement of a sufficiently long retention time) and that the power consumption of the resetting operation is sufficiently small.

The sufficiently long retention time can be secured by setting the valence of the cation X to at least divalence. Therefore, the movement of the cation X can be disturbed at room temperature while the potential gradient is eliminated.

The power consumption of the resetting operation can sufficiently be reduced by discovering a movement path of the cation X moving in the recording layer 12 because collapse of the crystal lattice is not generated.

The diffusion cation X will be described below.

As described above, because the diffusion cation X is disposed in the vacant site of the recording layer 12, the diffusion of the diffusion cation X and the thermal stability are simultaneously satisfied when the diffusion cation X is divalent. Therefore, preferably the diffusion cation X is divalent. Preferably Zn, Cd, Hg, Mg, Ca, Sr, Cu, Ni, Co, Fe, Mn, Cr, and V are used as the diffusion cation X.

Because the oxidation agent is generated on the side of the electrode layer (anode) 11 after the setting operation, preferably the electrode layer 11 is made of an oxidation-resistant material (such as conductive nitride and conductive oxide). Preferably, the oxidation-resistant material does not have an ionic conduction property.

The oxidation-resistant materials that do not have the ionic conduction property are shown below. Among other materials, it can be said that $LaNiO_3$ is the most preferable material from an overall perspective, to which good electric conductivity and the like are added.

(a) MN

M is at least one kind of an element that is selected from a group comprising of Ti, Zr, Hf, V, Nb, and Ta. N is nitrogen.

(b) $MO_X$

M is at least one kind of an element that is selected from a group comprising of Ti, V, Cr, Mn, Fe, Co, Ni, Cu, Zr, Nb, Mo, Ru, Rh, Pd, Ag, Hf, Ta, W, Re, Ir, Os, and Pt. A molar ratio x satisfies $1 \leq x \leq 4$.

(c) $AMO_3$

A is at least one kind of an element that is selected from a group comprising of La, K, Ca, Sr, Ba, and Ln (Lanthanide).

M is at least one kind of an element that is selected from a group comprising of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

(d) $A_2MO_4$

A is at least one kind of an element that is selected from a group comprising of K, Ca, Sr, Ba, and Ln (Lanthanide).

M is at least one element that is selected from a group comprising of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

Because the reductant agent is generated on the side of the protective layer (cathode) 13 after the setting operation, preferably the protective layer 13 has a function of preventing the recording layer 12 from reacting with air.

Semiconductors such as amorphous carbon, diamond-like carbon, and $SnO_2$ can be cited as examples of the protective layer 13.

The electrode layer 13A may act as a protective layer that protects the recording layer 12, or the protective layer may be provided instead of the electrode layer 13A. In such cases, the protective layer may be made of the insulator or the conductor.

In order to efficiently heat the recording layer 12 during the resetting operation, a heater layer (a material having resistivity of about $10^{-5}$ Ωcm or more) may be provided on the cathode side, which, in the embodiment, is the side of the electrode layer 13A.

In order to orient the ion diffusion path of the recording layer 12 in a direction perpendicular to a film surface of the recording layer 12, preferably the recording layer 12 includes a material expressed by $M_3N_4$, $M_3N_5$, $MN_2$, $M_4O_7$, $MO_2$, and $M_2O_5$ (M is at least one kind of an element that is selected from a group comprising of Si, Ge, Sn, Zr, Hf, Nb, Ta, Mo, W, Ce, and Tb) as an underlying layer of the electrode layer/recording layer.

In the operation, the initial state of the recording layer 12 is in the metallic state by way of example. The same holds true for the case in which the initial state of the recording layer 12 is in the insulator state.

A basic structure of the recording portion of the embodiment will be described below.

Figure 2:
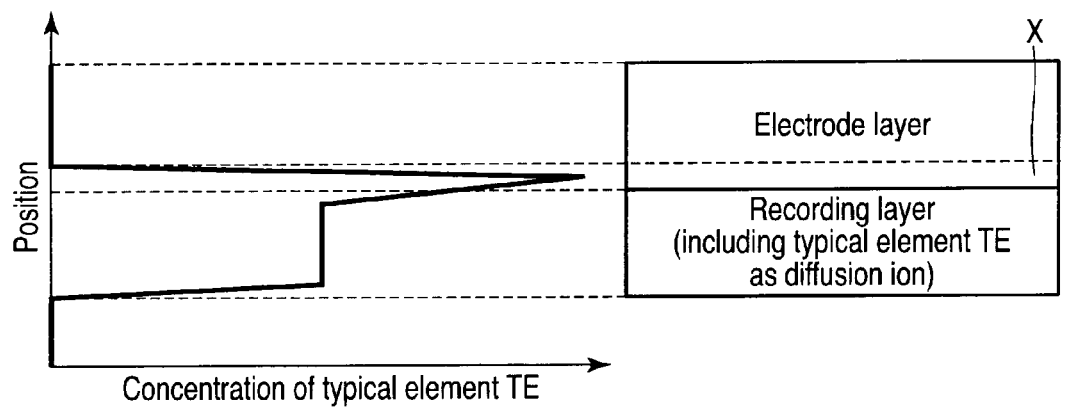
FIG. 2 is a view illustrating a first basic structure.

FIG. 2 illustrates a first basic structure.

The recording layer includes the typical element TE that is the diffusion ion, and the recording layer takes at least two states having different electric resistivities by the movement of the typical element TE. For example, the recording layer is made of $ZnMn_2O_4$.

The electrode layer is disposed at one and of the recording layer, and the voltage or the current is provided to the recording layer.

The electrode layer includes a typical element TE in a region X that is in contact with the recording layer, and the concentration of the typical element TE as the additive (dopant) is higher than that of the typical element TE in the recording layer. In the electrode layer, the region X that is in contact with the recording layer has a diffusion preventing function of preventing the element from diffusing into the electrode layer.

Accordingly, even if the post-annealing treatment (heat treatment) is performed after the recording layer/electrode layer is formed, the typical element TE that is the diffusion ion in the recording layer does not diffuse to the electrode layer, but the concentration of the typical element TE that is the diffusion ion in the recording layer can be kept constant before and after the post-annealing treatment.

Accordingly, the setting/resetting operation can stably be performed.

Figure 3:
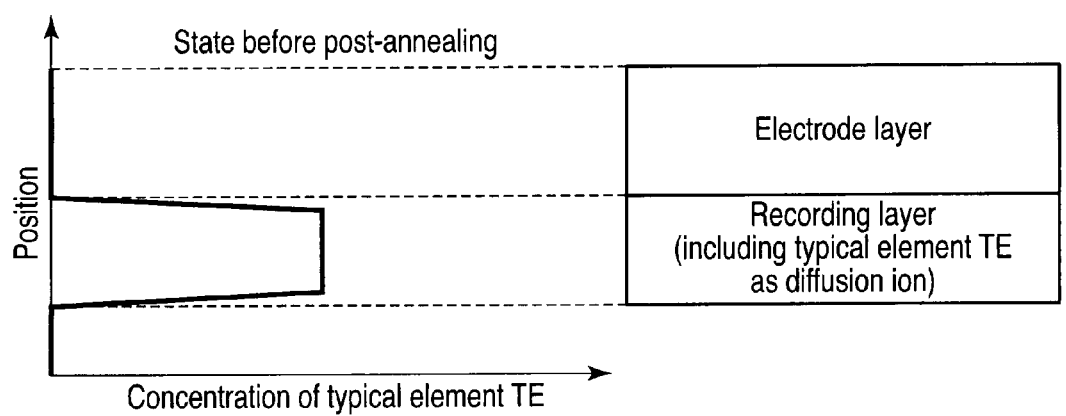
FIG. 3 is a view illustrating a structure as a comparative example.
Figure 4:
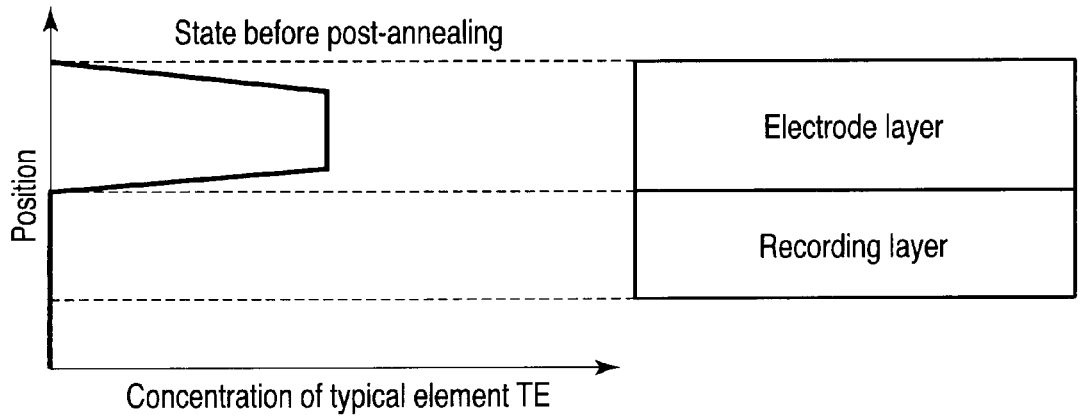
FIG. 4 is a view illustrating a structure as a comparative example.

FIGS. 3 and 4 illustrate a structure as a comparative example.

FIG. 3 illustrates a concentration distribution of the typical element TE that is the diffusion ion before the post-annealing treatment, and FIG. 4 illustrates a concentration distribution of the typical element TE that is the diffusion ion after the post-annealing treatment.

In the comparative example, as illustrated in FIG. 3, before the post-annealing treatment, the typical element TE that is the diffusion ion is evenly included in the recording layer, and the typical element TE that is the diffusion ion does not have a concentration peak in the region of the electrode layer that is in contact with the recording layer or the region of the recording layer that is in contact with the electrode layer.

Accordingly, as illustrated in FIG. 4, after the post-annealing treatment, the setting/resetting operation cannot stably be performed because almost all typical elements TE that are of the diffusion ion in the recording layer diffuse into the electrode layer.

In the first basic structure illustrated in FIG. 2, the typical element TE that is the diffusion ion existing in the region of the electrode layer that is in contact with the recording layer or the region of the recording layer that is in contact with the electrode layer diffuses slightly into the electrode layer during the post-annealing treatment. However, a concentration profile of the typical element TE that is the diffusion ion does not change largely by the slight diffusion of the typical element TE, and the typical element TE that is the diffusion ion has the concentration peak in the region of the electrode layer that is in contact with the recording layer or the region of the recording layer that is in contact with the electrode layer even after the post-annealing treatment.

That is, in the first basic structure, unlike the comparative example, the concentration distribution of the typical element TE that is the diffusion ion in the recording layer does not change before and after the post-annealing treatment.

Accordingly, as described above, the setting/resetting operation can stably be performed.

Figure 5:
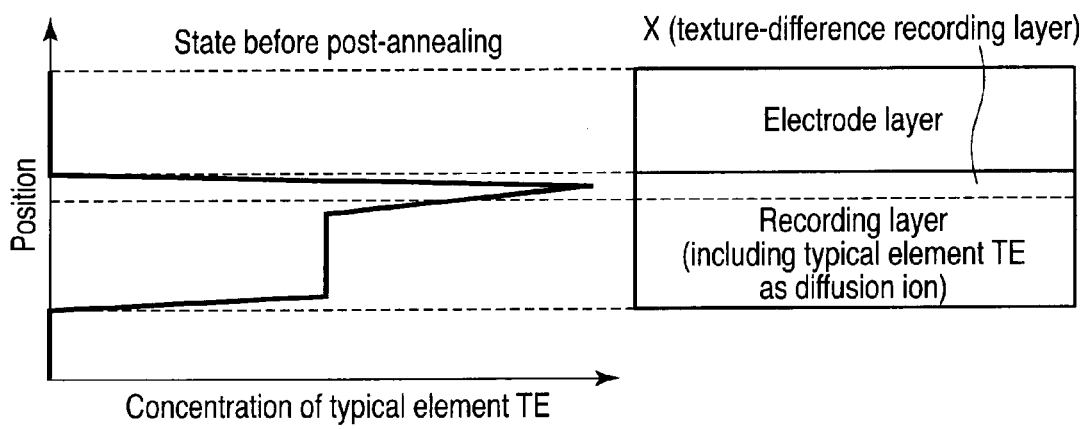
FIG. 5 is a view illustrating a second basic structure.

FIG. 5 illustrates a second basic structure.

The recording layer includes the typical element TE that is the diffusion ion, and the recording layer takes at least two states having different electric resistivities by the movement of the typical element TE. For example, the recording layer is made of $ZnMn_2O_4$.

The electrode layer is disposed at one end of the recording layer, and the voltage or the current is provided to the recording layer.

The electrode layer includes a typical element TE as the additive (dopant) in a region X that is in contact with the recording layer, and the concentration of the typical element TE as the additive (dopant) is higher than that of the typical element TE in the recording layer. The region X of the recording layer that is in contact with the electrode layer includes the typical element TE that is the diffusion ion having the concentration higher than the concentration in other regions of the region X. That is, the region of the recording layer that is in contact with the electrode layer constitutes a composition-difference recording layer whose concentration differs from that in other regions of the recording layer. In the electrode layer, the region X that is in contact with the recording layer has the diffusion preventing function of preventing the element from diffusing into the electrode layer.

Similarly to the first basic structure, when the post-annealing treatment (heat treatment) is performed after the recording layer/electrode layer is formed, the typical element TE that is the diffusion ion in the recording layer does not diffuse to the electrode layer, but the concentration of the typical element TE that is the diffusion ion in the recording layer can be kept constant before and after the post-annealing treatment.

Accordingly, the setting/resetting operation can stably be performed.

Figure 6:
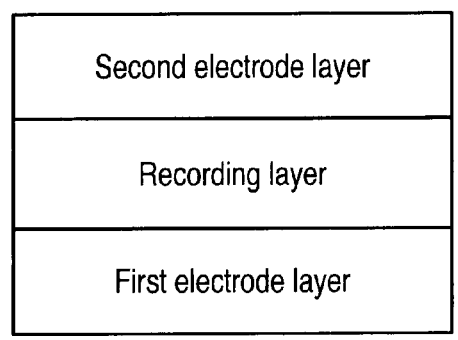
FIG. 6 is a view illustrating a third basic structure.

FIG. 6 illustrates a third basic structure.

The third basic structure differs from the first and second basic structures in that the electrode layers are disposed at both ends of the recording layer.

The recording layer includes the typical element TE that is the diffusion ion, and takes at least two states having different electric resistivities by the movement of the typical element TE. For example, the recording layer is made of $ZnMn_2O_4$.

The recording layer is sandwiched between the first and second electrode layers, and the first and second electrode layers are used to provide the voltage or current to the recording layer for the purpose of the movement of the typical element TE.

At least one of the concentration distribution of the typical element near an interface between the first electrode layer and the recording layer and the concentration distribution of the typical element near an interface between the second electrode layer and the recording layer is set identical to the concentration distribution illustrated in FIG. 2 (first basic structure) or FIG. 5 (second basic structure).

The reason why the concentration distribution of FIG. 2 or FIG. 5 is applied to at least one of the two interfaces is that occasionally the typical element TE that is the diffusion ion in the recording layer hardly diffuses into the electrode layer, according to the electrode material.

When the typical element possibly diffuses into the first and second electrode layers while the first and second electrode layers are made of the identical material, obviously the concentration distribution of FIG. 2 or FIG. 5 is preferably applied to the two interfaces.

4. Embodiments

Some embodiments of the invention will be described.

The case in which the embodiment of the invention is applied to a probe type solid-state memory and the case in which the embodiment of the invention is applied to a cross-point type solid-state memory will be described below.

(1) Probe Type Solid-State Memory

A. Structure

Figure 7:
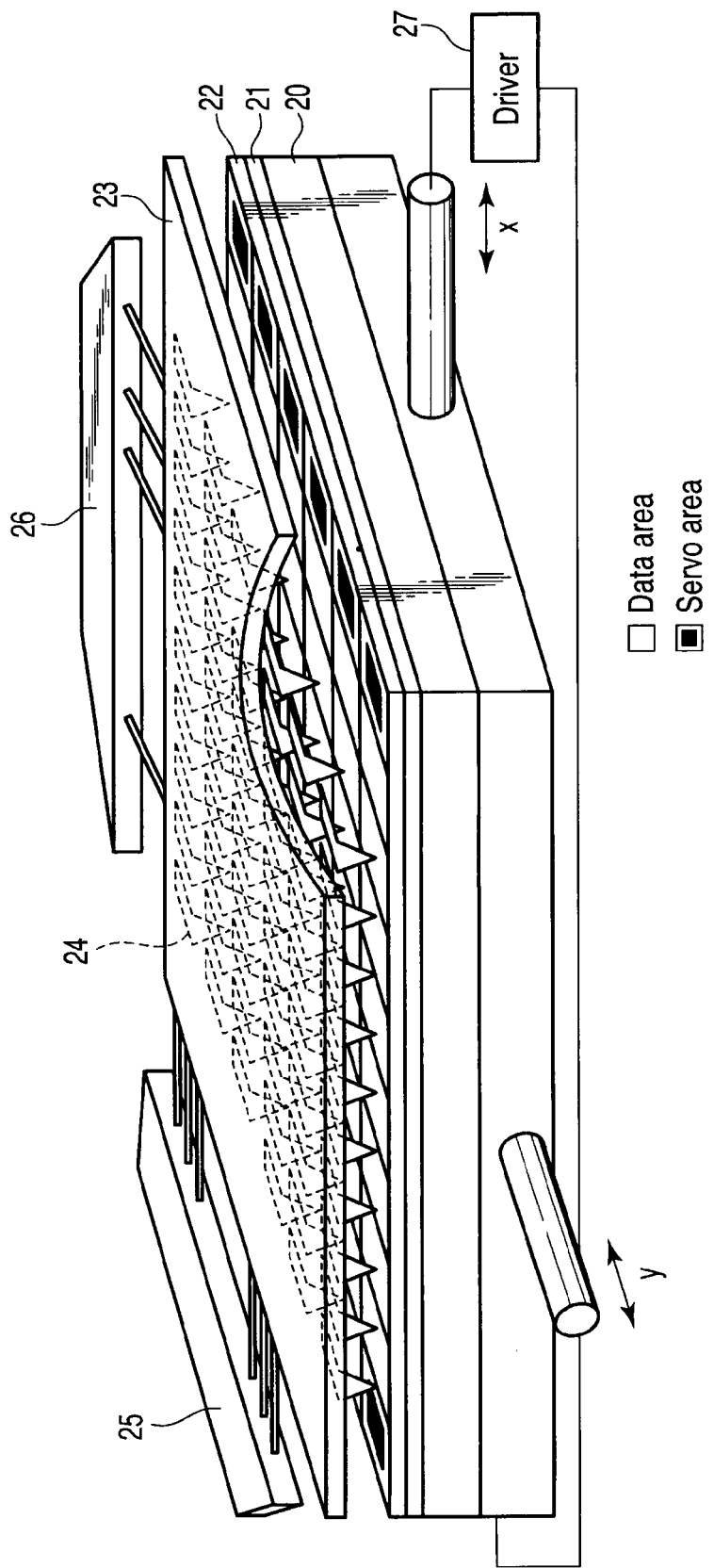
FIG. 7 is a view illustrating a probe type solid-state memory.
Figure 8:
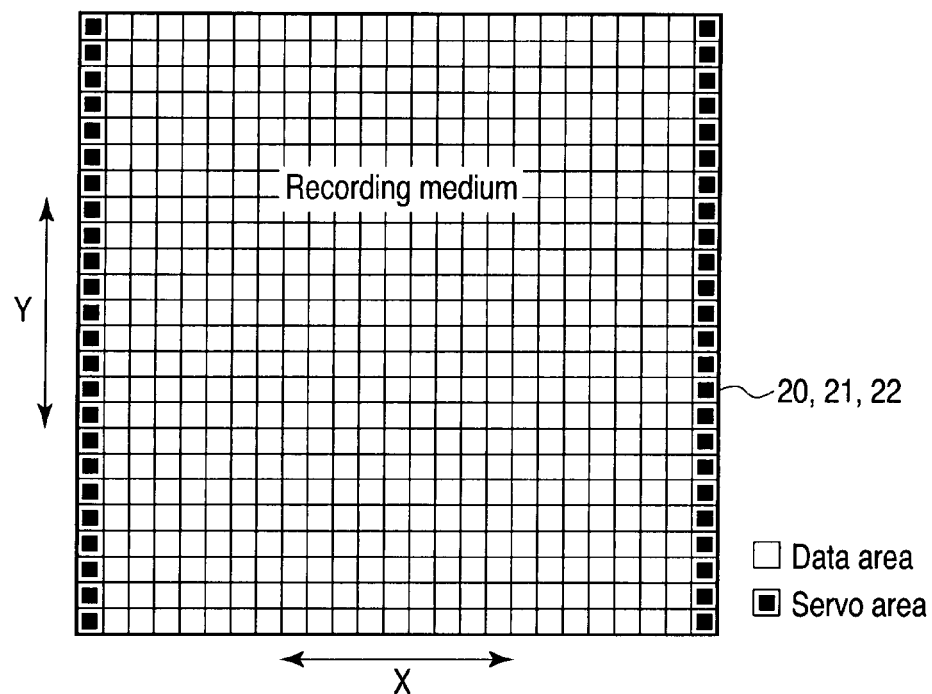
FIG. 8 is a view illustrating segmentation of a recording medium.

FIGS. 7 and 8 illustrate a probe type fixed memory according to an embodiment of the invention.

An electrode layer 21 is disposed on a semiconductor substrate 20, and a recording portion 22 including a data area and a servo area is disposed on the electrode layer 21. For example, the recording portion (recording medium) 22 is formed by the recording layer 12 illustrated in FIG. 2. The recording portion 22 is directly formed in a central portion of the semiconductor substrate 20.

The servo area is disposed along an edge of the semiconductor substrate 20.

Each of the data area and the servo area includes plural blocks. Plural probes 24 corresponding to the plural blocks are disposed on the data area and the servo area. Each of the plural probes 24 has a pointed shape.

The plural probes 24 comprise a probe array and are formed on one surface side of the semiconductor substrate 23. The plural probes 24 can easily be formed on one surface side of the semiconductor substrate 23 by utilizing the MEMS technology.

A position of the probe 24 on the data area is controlled by a servo burst signal that is read from the servo area. Specifically, a driver 27 reciprocates the semiconductor substrate 20 in an X-direction to control the positions of the plural probes 24 in a Y-direction, thereby performing an access operation.

Alternatively, a recording medium is independently formed in each block, the recording medium has the structure in which the recording medium rotates like a hard disk, and each of the plural probes 24 may move in a radial direction of the recording medium, for example, in an X-direction.

Each of the plural probes 24 acts as a recording/erasing head and a reproducing head. Multiplex drivers 25 and 26 supply predetermined voltages to the plural probes 24 during the recording, reproduction, and erasing.

B. Recording/Reproducing Operation

The recording/reproducing operation of the probe type solid-state memory of FIGS. 7 and 8 will be described.

Figure 9:
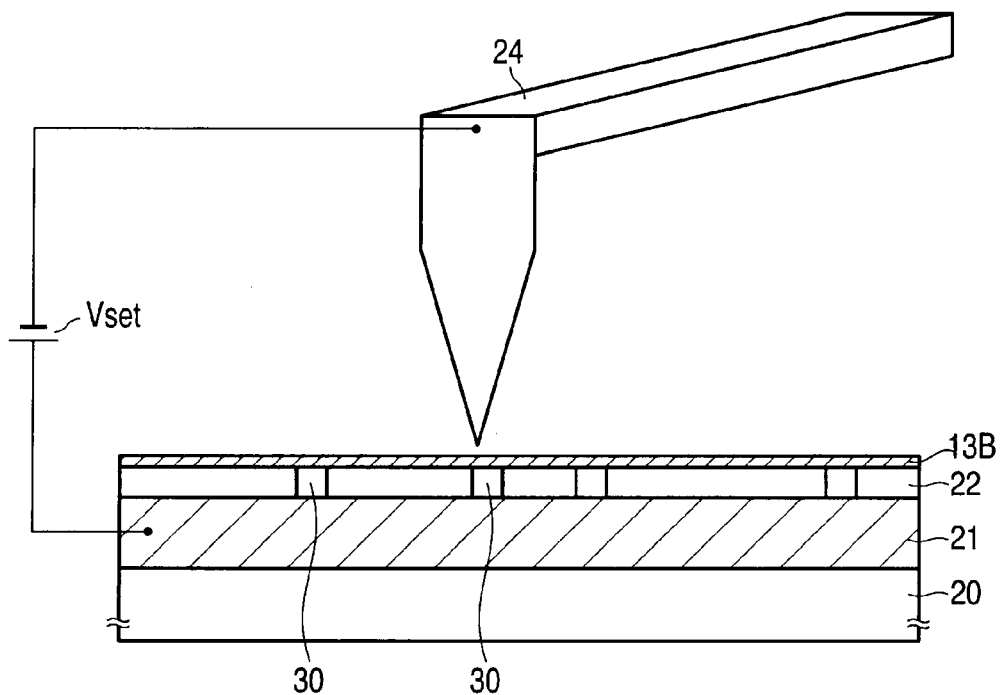
FIG. 9 is a view illustrating a state during recording.

FIG. 9 illustrates the recording operation (setting operation).

The recording portion (recording medium) 22 is formed on the electrode layer 21 provided on the semiconductor chip 20. The recording portion 22 is covered with the protective layer 13B.

A leading end of the probe 24 is brought into contact with the surface of the protective layer 13B, and a voltage pulse is applied to the recording unit 30 of the recording portion (recording medium) 22 to generate the potential gradient in the recording unit 30 of the recording portion 22, thereby performing the information recording. In the embodiment, a potential at the probe 24 is relatively lower than a potential at the electrode layer 21. A negative potential may be provided to the probe 24 when the electrode layer 21 is set to a fixed potential (for example, ground potential).

For example, the voltage pulse may be generated by emitting electrons from the probe 24 toward the electrode layer 21 using an electron generation source or a hot electron source.

Figure 10:
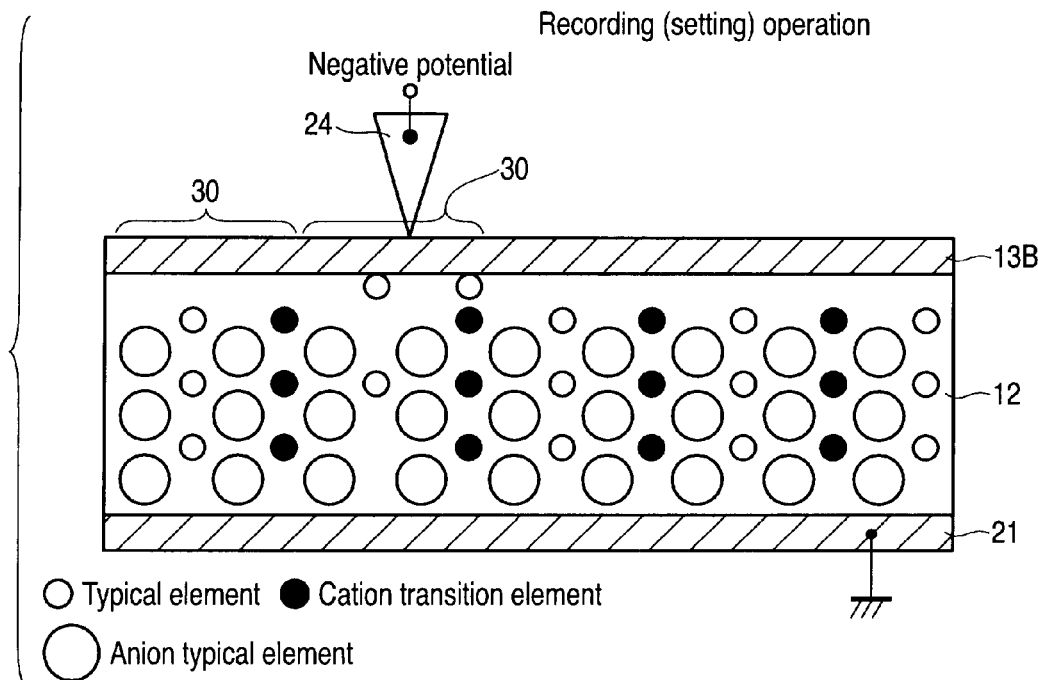
FIG. 10 is a view illustrating a recording operation.

At this point, for example, as illustrated in FIG. 10, some diffusion ions move onto the side of the probe (cathode) 24 in the recording unit 30 of the recording layer 12, and the number of diffusion ions in the crystal decreases relative to the number of anions. The diffusion ions that move onto the probe 24 receive electrons from the probe 24 to be deposited in the form of metal.

In the recording unit 30 of the recording layer 12, the anions become excessive to raise the valences of the transition element ions that are left in the recording layer 12. That is, the recording unit 30 of the recording layer 12 has an electron conduction property due to carrier injection of the phase change, thereby completing the information recording (setting operation).

The voltage pulse for the information recording can also be generated by setting the potential at the probe 24 relatively higher than the potential at the electrode layer 21.

According to the probe type solid-state memory of the embodiment, similarly to the hard disk, the information recording can be performed to the recording unit 30 of the recording medium, and the recording density higher than that of the conventional hard disk or semiconductor memory can be realized by using a novel recording material.

Figure 11:
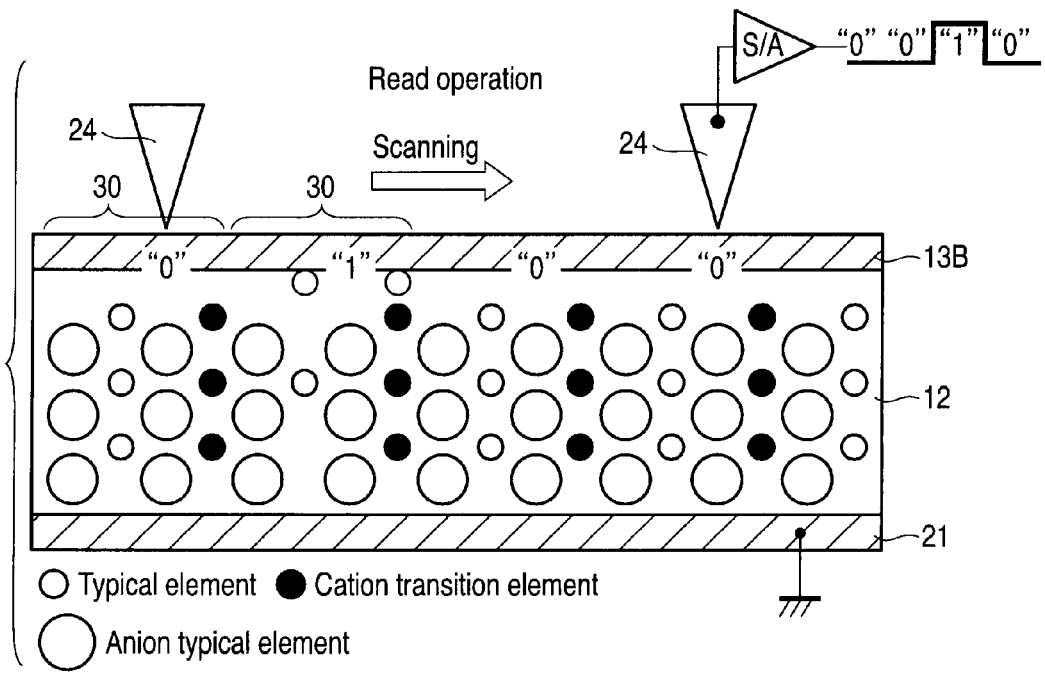
FIG. 11 is a view illustrating a reproducing operation.

FIG. 11 illustrates the reproducing operation. The voltage pulse is supplied to the recording unit 30 of the recording layer 12 to detect a resistance value of the recording unit 30 of the recording layer 12, thereby performing the reproducing operation. However, the voltage pulse is set to a minute value to an extent at which the phase change is not generated in the material used in the recording unit 30 of the recording layer 12.

For example, a read current generated by a sense amplifier S/A is passed from the probe 24 to the recording unit 30 of the recording layer 12, and the resistance value of the recording unit 30 is measured with the sense amplifier S/A. A resistance ratio of the high-resistance state and the low-resistance state of $10^3$ or more can be secured when the novel material is used.

In the reproducing operation, the continuous reproduction can be performed by scanning the recording medium with the probe 24.

The recording unit 30 of the recording layer 12 is subjected to the Joule heating by the large current pulse to promote the redox reaction in the recording unit 30 of the recording layer 12, thereby performing the erasing (resetting) operation. Alternatively, the voltage pulse in the opposite direction to the setting operation may be applied to the recording layer 12 to perform the erasing operation.

The erasing operation can be performed in each recording unit 30 or in the plural recording units 30 or each block unit.

C. Summary

According to the probe type solid-state memory of the embodiment, the high recording density and the low power consumption can be realized compared with the current hard disk or flash memory.

(2) Cross-Point Type Solid-State Memory

A. Structure

Figure 12:
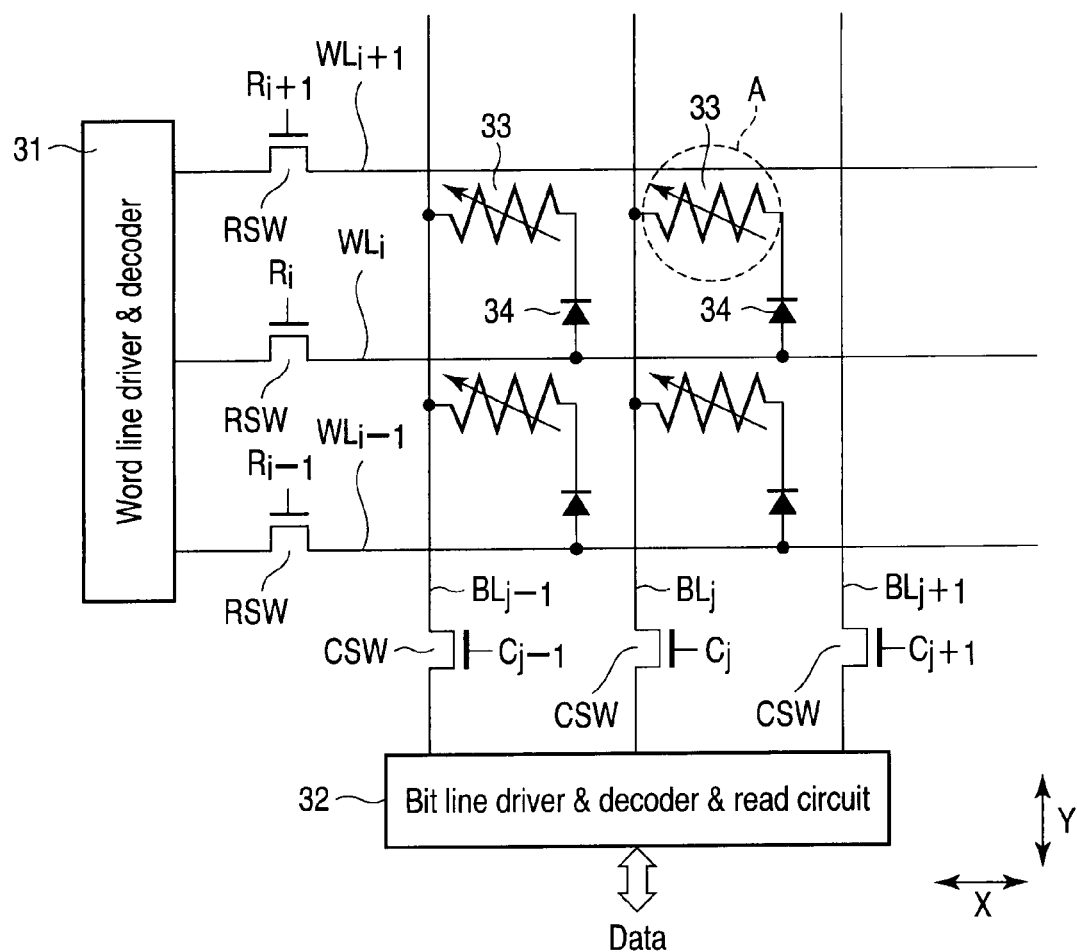
FIG. 12 is a view illustrating a cross-point type solid-state memory.

FIG. 12 illustrates a cross-point type solid-state memory according to an embodiment of the invention.

Word lines $WL_{i-1}$, $WL_i$, and $WL_{i+1}$ extend in the X-direction, and bit lines $BL_{j-1}$, $BL_j$, and $BL_{j+1}$ extend in the Y-direction.

One end of each of the word lines $WL_{i-1}$, $WL_i$, and $WL_{i+1}$ is connected to a word line driver and decoder 31 through a MOS transistor RSW that is a selection switch. One end of each of the bit lines $BL_{j-1}$, $BL_j$, and $BL_{j+1}$ is connected to a bit line driver, a decoder and a read circuit 32 through a MOS transistor CSW that is a selection switch.

Selection signals $R_{i-1}$, $R_i$, and $R_{i+1}$ are input to gates of the MOS transistors RSW to select one word line (row), and selection signals $C_{j-1}$, $C_j$, and $C_{j+1}$ are input to gates of the MOS transistors CSW to select one bit line (column).

A memory cell 33 is disposed in an intersection portion of each of the word lines $WL_{i-1}$, $WL_i$, and $WL_{i+1}$ and each of the bit lines $BL_{j-1}$, $BL_j$, and $BL_{j+1}$. This is a so-called cross-point type cell array structure.

A diode 34 is added to the memory cell 33 in order to prevent a sneak current during the recording/reproduction.

Figure 13:
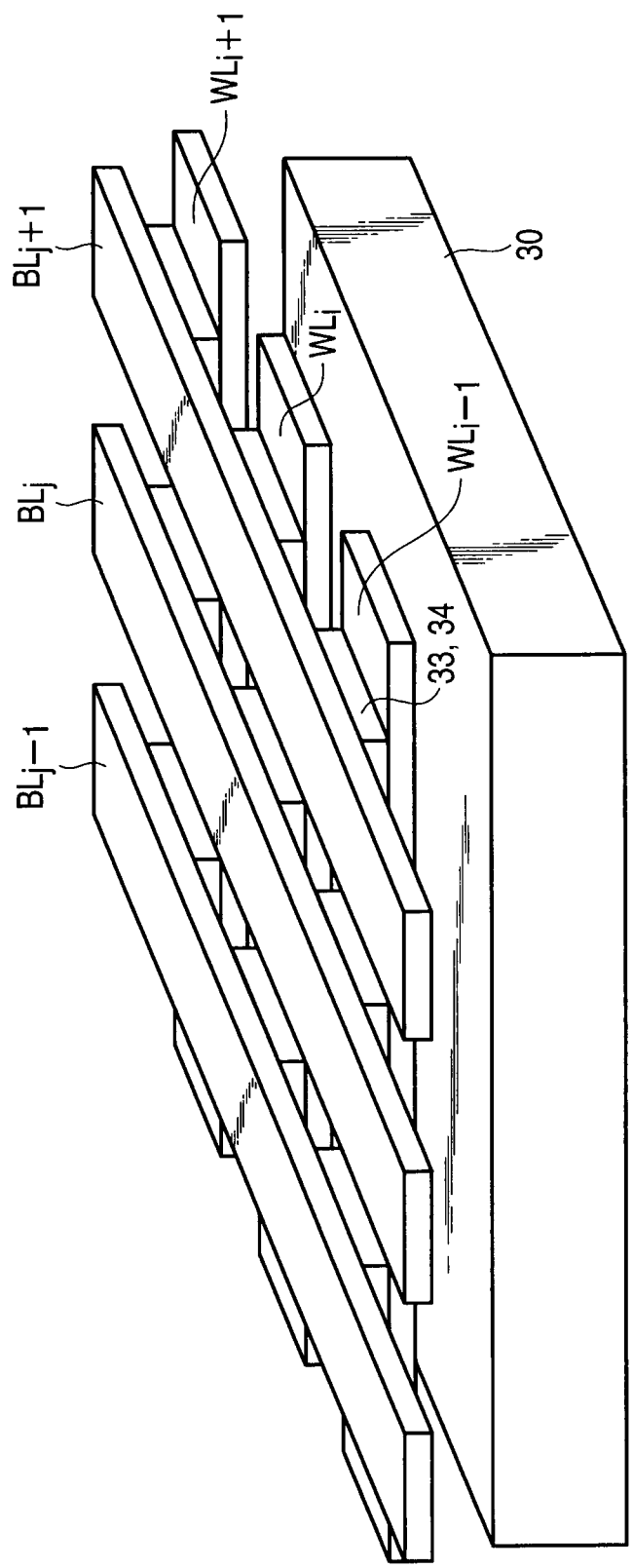
FIGS. 13 to 15 are views, each illustrating a structure of a memory cell array.

FIG. 13 illustrates a structure of a memory cell array portion of the cross-point type solid-state memory of FIG. 12.

The word lines $WL_{i-1}$, $WL_i$, and $WL_{i+1}$ and the bit lines $BL_{j-1}$, $BL_j$, and $BL_{j+1}$ are disposed on the semiconductor chip 30, and the memory cell 33 and the diode 34 are disposed in the intersection portion of the interconnections.

Figure 14:
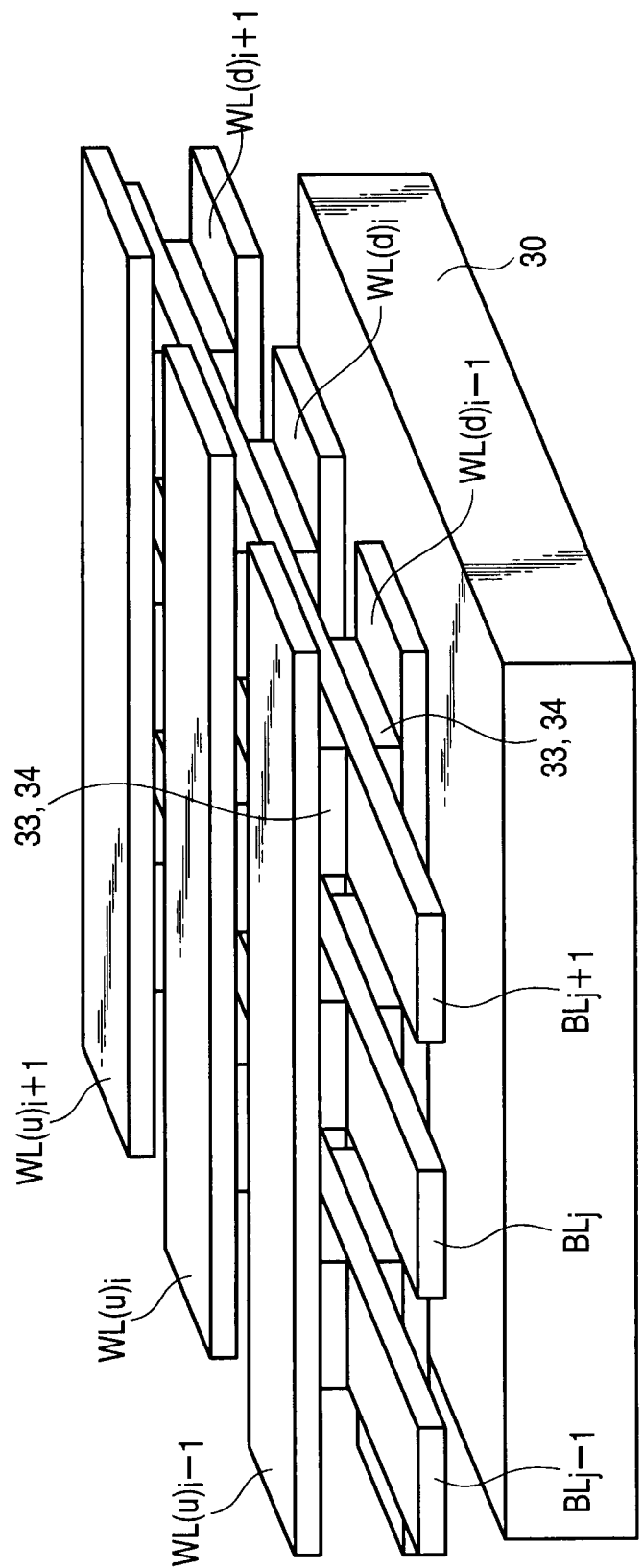
Figure 15:
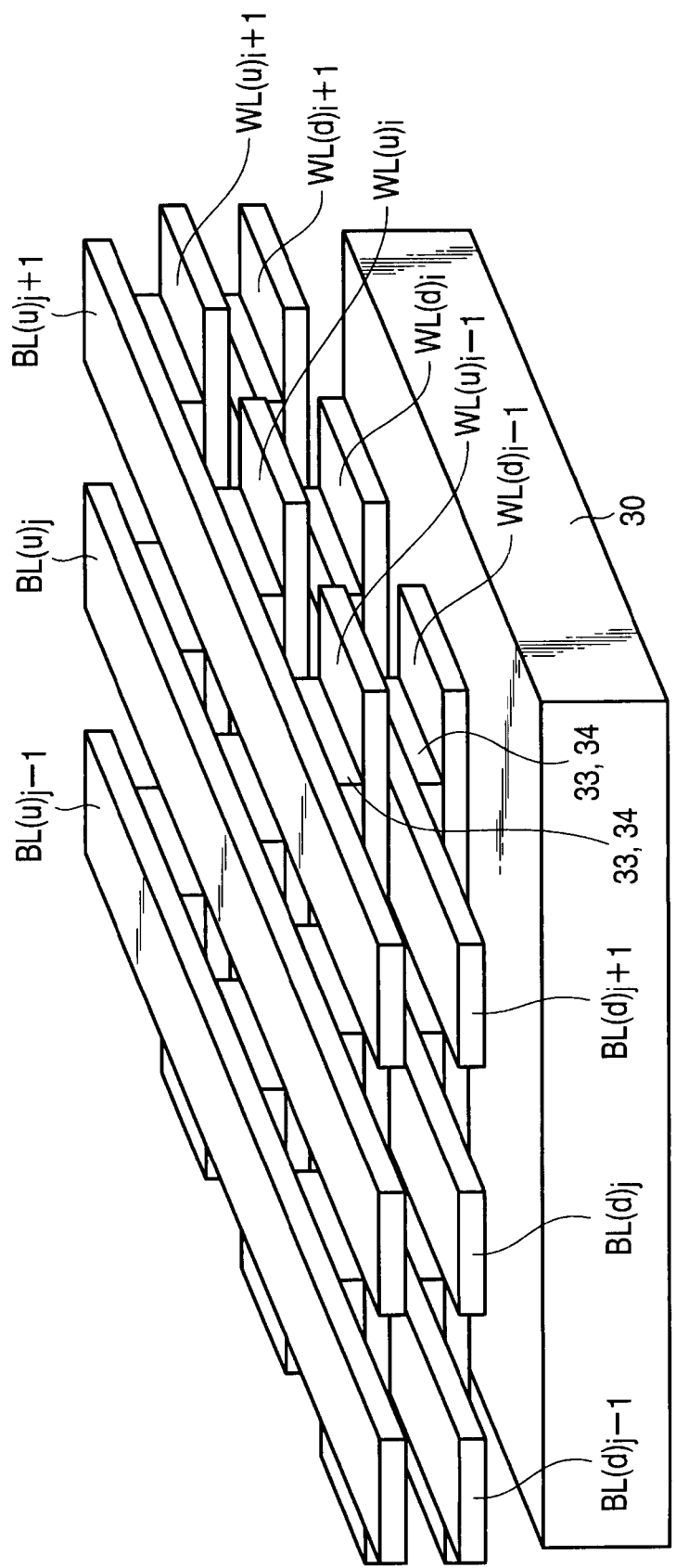

The most distinctive feature of the cross-point type cell array structure is that high integration is advantageously achieved because the necessity to individually connect the MOS transistor to the memory cell 33 is eliminated. For example, as illustrated in FIGS. 14 and 15, the memory cells 33 can be stacked to form a three-dimensional structure of the memory cell array.

A structural example of the memory cell 33 will be described.

FIG. 16 illustrates a first example of the memory cell.

The diode 34 is formed on the word line $WL_i$, and the memory cell 33 is formed on the diode 34. The memory cell 33 has a stacked structure of electrode layer 11A/recording layer 12/electrode layer 11B. The bit line $BL_j$ is formed on the memory cell 33.

The electrode layer 11B includes the typical element that is the diffusion ion in the recording layer 12, that is, zinc (Zn) as the additive (dopant). The amount (concentration) of zinc included in the electrode layer 11B is higher than an amount (concentration) of zinc (Zn) in the recording layer 12.

FIG. 17 illustrates a second example of the memory cell.

The diode 34 is formed on the word line $WL_i$, and the memory cell 33 is formed on the diode 34. The memory cell 33 has the stacked structure of the electrode layer 11A/the recording layer 12/the electrode layer 11B. The recording layer 12 includes a composition-difference recording layer 12B that exists in the region that is in contact with the electrode layer 11B and a recording layer body 12A that exists in other regions. The bit line $BL_j$ is formed on the memory cell 33.

The recording layer body 12A and the composition-difference recording layer 12B are made of an identical material, and the recording layer body 12A differs from the composition-difference recording layer 12B only in a composition ratio of elements constituting the material. For example, the recording layer body 12A is made of $ZnMn_2O_4$, and the composition-difference recording layer 12B is made of $ZnMnO_3$.

However, the amount (concentration) of the typical element that is the diffusion ion in the composition-difference recording layer 12B, that is, zinc (Zn) is higher than the amount (concentration) of zinc (Zn) in the recording layer 12A.

FIG. 18 illustrates a third example of the memory cell.

The third example has a structure in which the first example and second example are combined.

The diode 34 is formed on the word line $WL_i$, and the memory cell 33 is formed on the diode 34. The memory cell 33 has the stacked structure of the electrode layer 11A/the recording layer 12/the electrode layer 11B. The recording layer 12 includes the composition-difference recording layer 12B that exists in the region that is in contact with the electrode layer 11B and the recording layer body 12A that exists in other regions. The bit line $BL_j$ is formed on the memory cell 33.

The recording layer body 12A and the composition-difference recording layer 12B are made of the identical material, and the recording layer body 12A differs from the composition-difference recording layer 12B only in the composition ratio of elements constituting the material. For example, the recording layer body 12A is made of $ZnMn_2O_4$, and the composition-difference recording layer 12B is made of $ZnMnO_3$.

However, the amount (concentration) of the typical element that is the diffusion ion in the composition-difference recording layer 12B, that is, zinc (Zn) is higher than the amount (concentration) of zinc (Zn) in the recording layer 12A.

The electrode layer 11B includes the typical element that is the diffusion ion in the recording layer 12, that is, zinc (Zn) as the additive (dopant). The amount (concentration) of zinc included in the electrode layer 11B is higher than the amount (concentration) of zinc (Zn) in the recording layer 12A.

FIG. 19 illustrates a fourth example of the memory cell.

The fourth example is an application example of the first example, and the most distinctive feature of the fourth example is that the typical element that is the diffusion ion in the recording layer 12 is included as the additive (dopant) in the electrode layers 11A and 11B that exist at both ends of the recording layer 12.

The diode 34 is formed on the word line $WL_i$, and the memory cell 33 is formed on the diode 34. The memory cell 33 has the stacked structure of the electrode layer 11A/the recording layer 12/the electrode layer 11B. The bit line $BL_j$ is formed on the memory cell 33.

Each of the electrode layers 11A and 11B include the typical element that is the diffusion ion in the recording layer 12, that is, zinc (Zn) as the additive (dopant). The amount (concentration) of zinc included in each of the electrode layers 11A and 11B is higher than the amount (concentration) of zinc (Zn) in the recording layer 12.

FIG. 20 illustrates a fifth example of the memory cell.

The fifth example is an application example of the second example, and the most distinctive feature of the fifth example is that the composition-difference recording layers 12A and 12B are disposed at both ends of the recording layer body 12A.

The diode 34 is formed on the word line $WL_i$, and the memory cell 33 is formed on the diode 34. The memory cell 33 has the stacked structure of the electrode layer 11A/the recording layer 12/the electrode layer 11B. The recording layer 12 includes the composition-difference recording layer 12B that exists in the region that is in contact with the electrode layer 11B, a composition-difference recording layer 12C that exists in the region that is in contact with the electrode layer 11A, and the recording layer body 12A that exists in other regions. The bit line $BL_j$ is formed on the memory cell 33.

The recording layer body 12A and the composition-difference recording layers 12B, 12C are made of the identical material, and the recording layer body 12A differs from the composition-difference recording layers 12B and 12C only in the composition ratio of elements constituting the material. For example, the recording layer body 12A is made of $ZnMn_2O_4$, and the composition-difference recording layers 12B and 12C are made of $ZnMnO_3$.

However, the amount (concentration) of the typical element that is the diffusion ion in the composition-difference recording layers 12B and 12C, that is, zinc (Zn) is higher than the amount (concentration) of zinc (Zn) in the recording layer 12A.

A composition ratio of the two composition-difference recording layers 12B and 12C may be varied.

The data of at least one bit is stored in the memory cell 33. The diode 34 may be disposed not between the word line $WL_i$ and the memory cell 33, but between the bit line $BL_j$ and the memory cell 33.

At least one barrier metal may be disposed between the word line $WL_i$ and the diode 34 or between the memory cell 33 and the bit line $BL_j$.

Preferably, the diode 34 is eliminated when the setting/resetting operation is performed only by the orientation of the voltage.

B. Recording/Reproducing Operation

The recording/reproducing operation will be described with reference to FIGS. 12, 13, and 16. It is assumed that the memory cell 33 surrounded by a dotted line A is selected to perform the recording/reproducing operation.

In the information recording (setting operation), the voltage is applied to the selected memory cell 33, and the potential gradient is generated in the memory cell 33 to pass the current pulse through the memory cell 33. Therefore, for example, the potential at the word line $WL_i$ is set relatively lower than the potential at the bit line $BL_j$. The negative potential is provided to the word line $WL_i$ when the bit line $BL_j$ is set to the fixed potential (for example, ground potential).

At this point, in the selected memory cell 33 surrounded by the dotted line A, some diffusion ions move onto the side of the word line (cathode) $WL_i$, and the number of diffusion ions in the recording layer 12 decreases relative to the number of anions. The diffusion ions moving onto the side of the word line $WL_i$ receive electrons from the word line $WL_i$ to be deposited in the form of metal.

In the selected memory cell 33 surrounded by the dotted line A, the anions become excessive to increase the valences of transition element ions in the recording layer 12. That is, because the selected memory cell 33 surrounded by the dotted line A has the electron conduction property due to injection of phase change carriers, the information recording (setting operation) is completed.

Preferably, all the nonselected word lines $WL_{i-1}$ and $WL_{i+1}$ and all the nonselected bit lines $BL_{j-1}$ and $BL_{j+1}$ are biased to an identical potential during the information recording.

Preferably, all the word lines $WL_{i-1}$, $WL_i$, and $WL_{i+1}$ and all the bit lines $BL_{j-1}$, $BL_j$, and $BL_{j+1}$ are pre-charged during standby before the information recording.

The voltage pulse necessary for the information recording may be generated by setting the potential at the word line $WL_i$ to the state that is relatively higher than the potential at the bit line $BL_j$.

Because the Joule heat generated by passing the large current pulse through the selected memory cell 33 and the residual heat are utilized in the erasing (resetting) operation, for example, the potential at the word line $WL_i$ is set relatively higher than the potential at the bit line $BL_j$. The positive potential may be provided to the word line $WL_i$ when the bit line $BL_j$ is set to the fixed potential (for example, ground potential).

At this point, some cations move into the recording layer 12 of the memory cell 33 surrounded by the dotted line A. Therefore, the valences of the cations (transition elements) increase in the conductive oxide layer 15, and the valences of the cations (transition elements) decrease in the recording layer 12.

As a result, the memory cell 33 changes from the low-resistance state to the high-resistance state, and the resetting operation (erasing) is completed.

The erasing operation can also be performed by the following method.

However, in such cases, preferably the diode 34 is removed from the semiconductor memory of FIGS. 12, 13, and 16 as described above.

For example, the potential at the word line $WL_i$ is set relatively lower than the potential at the bit line $BL_j$. The negative potential may be provided to the word line $WL_i$ when the bit line $BL_j$ is set to the fixed potential (for example, ground potential).

At this point, in the memory cell 33 surrounded by the dotted line A, some cations in the conductive oxide layer 15 move into the recording layer 12. Therefore, the valences of the cations (transition elements) increase in the conductive oxide layer 15, and the valences of the cations (transition elements) decrease in the recording layer 12.

As a result, the memory cell 33 changes from the low-resistance state to the high-resistance state, and the resetting operation (erasing) is completed.

Preferably, all the nonselected word lines $WL_{i-1}$ and $WL_{i+1}$ and all the nonselected bit lines $BL_{j-1}$ and $BL_{j+1}$ are biased to the identical potential during the erasing.

Preferably, all the word lines $WL_{i-1}$, $WL_i$, and $WL_{i+1}$ and all the bit lines $BL_{j-1}$, $BL_j$, and $BL_{j+1}$ are pre-charged during standby before the erasing.

The current pulse is passed through the selected memory cell 33 surrounded by the dotted line A, and the resistance value of the memory cell 33 is detected to perform the read operation. However, it is necessary that the current pulse be set to a minute value to a degree at which the material of the memory cell 33 does not generate the phase change.

For example, the read current (current pulse) generated by the read circuit is passed from the bit line $BL_j$ through the memory cell 33 surrounded by the dotted line A, and the resistance value of the memory cell 33 is measured by the read circuit. A resistance value difference between the setting state and the resetting state of $10^3$ or more can be secured when the already-described novel material is used.

C. Summary

According to the cross-point type solid-state memory of the embodiment, the high recording density and the low power consumption can be realized compared with the current hard disk or flash memory.

(3) Other

Although the probe type solid-state memory and the cross-point type solid-state memory are described in the embodiment, the material and the principle that are proposed in the embodiment of the invention can also be applied to the current recording medium such as a hard disk and a DVD.

5. Application to Flash Memory (1) Structure

The embodiment of the invention can also be applied to a flash memory.

Figure 21:
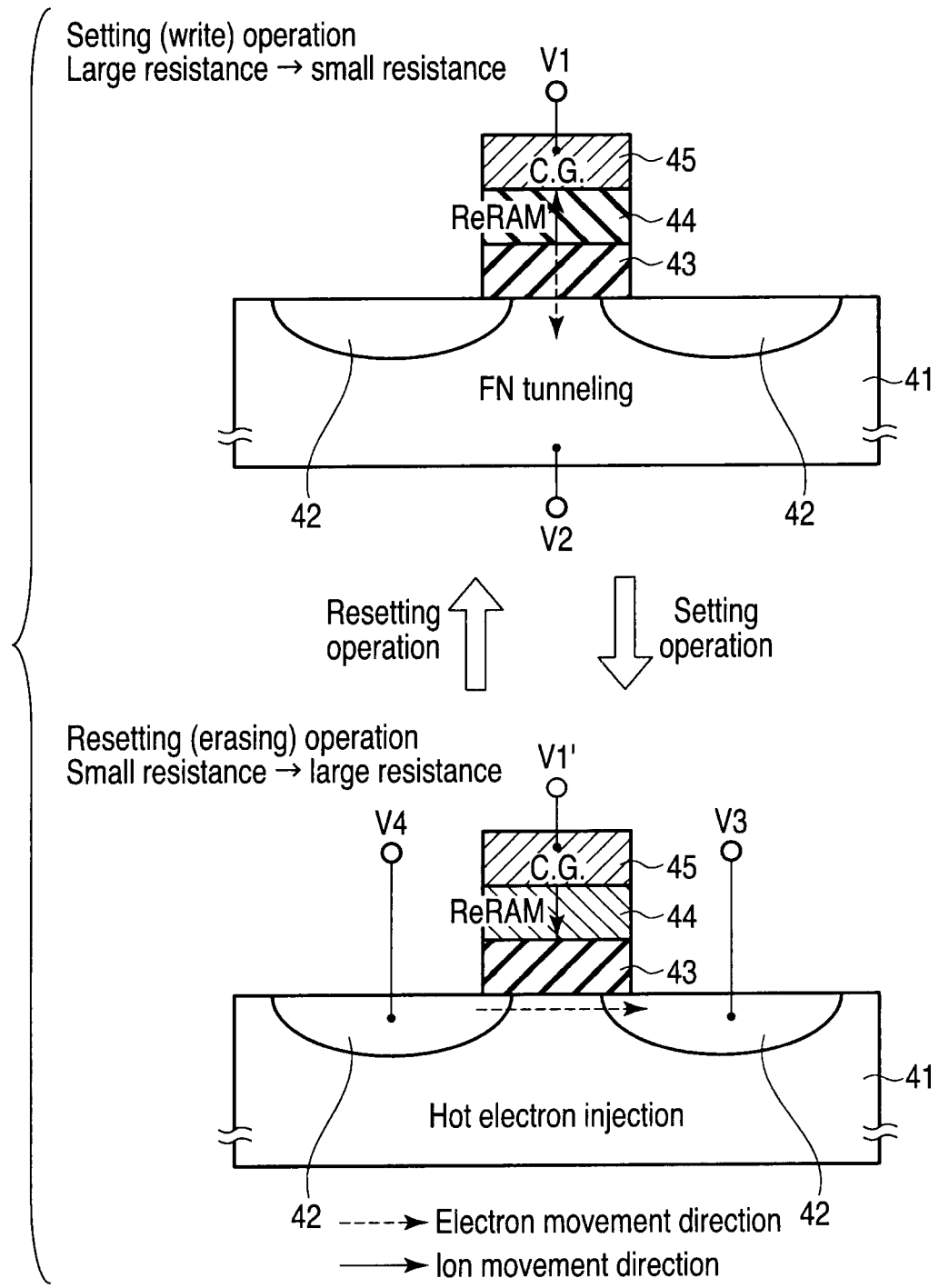
FIG. 21 is a view illustrating an example of application to a flash memory.

FIG. 21 illustrates a memory cell of the flash memory.

The memory cell of the flash memory includes an MIS (Metal-Insulator-Semiconductor) transistor.

A diffusion layer 42 is formed in a surface region of a semiconductor substrate 41. A gate insulator film 43 is formed on a channel region between the diffusion layers 42. A recording portion (ReRAM: Resistive RAM) 44 according to an embodiment of the invention is formed on a gate insulating layer 43. A control gate electrode 45 is formed on the recording portion 44.

The semiconductor substrate 41 may be a well region, and the semiconductor substrate 41 and the diffusion layer 42 have conductive types opposite to each other. The control gate electrode 45 constitutes the word line and is made of, for example, conductive polysilicon.

For example, the recording portion 44 is formed by the recording layer of FIG. 2, and the control gate electrode 45 is formed by the electrode layer of FIG. 2.

(2) Basic Operation

The basic operation will be described with reference to FIG. 21. In the setting (write) operation, a potential V1 is provided to the control gate electrode 45, and a potential V2 is provided to the semiconductor substrate 41.

It is necessary that a difference between the potentials V1 and V2 is of sufficient magnitude to generate the phase change or resistance change in the recording portion 44. However, there is no particular limitation to the orientation of the difference.

That is, either V1>V2 or V1<V2 may be used.

For example, assuming that the recording portion 44 is the insulator (large resistance) in the initial state (resetting state), a threshold of the memory cell (MIS transistor) is raised because the gate insulating layer 43 is substantially thickened.

When the potentials V1 and V2 are provided to change the recording portion 44 to the conductor (small resistance), the threshold of the memory cell (MIS transistor) is lowered because the gate insulating layer 43 is substantially thinned.

Although the potential V2 is provided to the semiconductor substrate 41, the potential V2 may be transferred from the diffusion layer 42 to the channel region of the memory cell.

A potential V1' is provided to the control gate electrode 45, a potential V3 is provided to one of the diffusion layers 42, and a potential V4 (<V3) is provided to the other diffusion layer 42, thereby performing the resetting (erasing) operation.

The potential V1' is set to a value that exceeds the threshold of the memory cell in the setting state.

At this point, the memory cell is turned on, the electrons flow from the other diffusion layer 42 toward one of the diffusion layers 42, and the hot electrons are generated. A temperature of the recording portion 44 is raised because the hot electrons are injected into the recording portion 44 through the gate insulating layer 43.

Therefore, because the recording portion 44 changes from the conductor (small resistance) to the insulator (large resistance), the gate insulating layer 43 is substantially thickened to raise the threshold of the memory cell (MIS transistor).

The threshold of the memory cell is changed by the principle similar to that of the flash memory, so that the information recording and reproducing device according to the embodiment of the invention can be implemented by utilizing the flash memory technology.

(3) NAND Type Flash Memory

Figure 24:
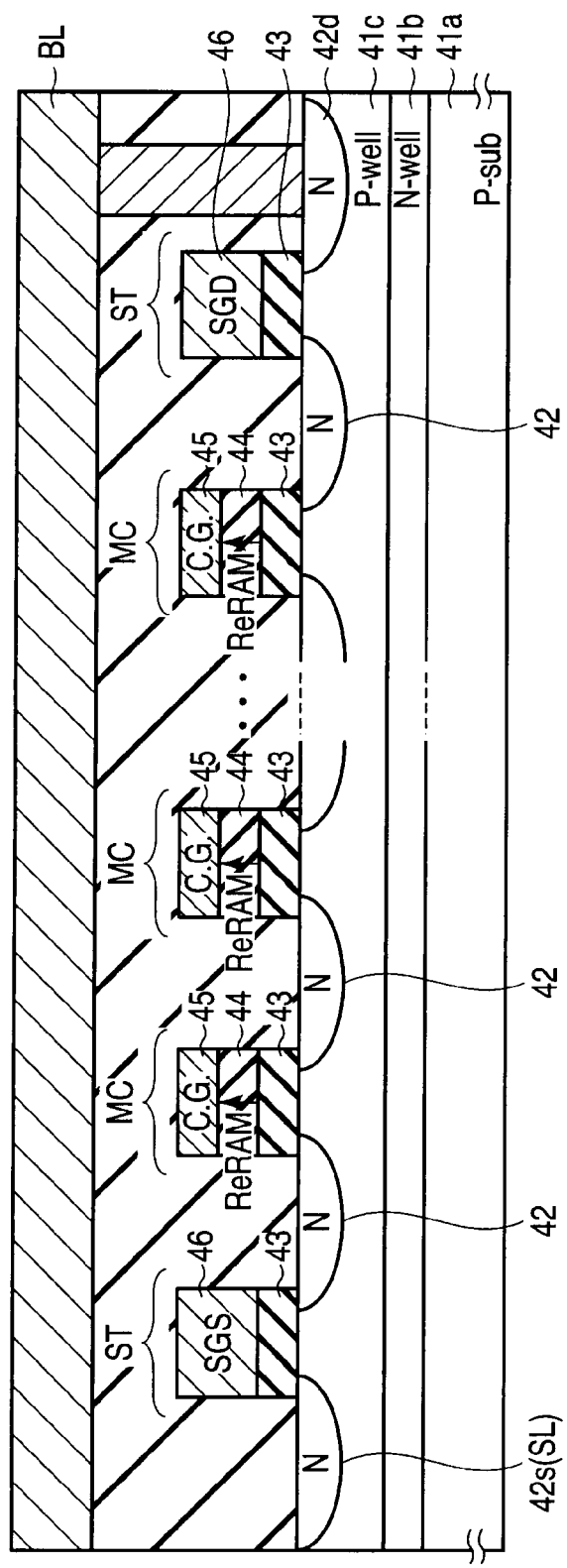

FIG. 22 illustrates a circuit diagram of a NAND cell unit. FIG. 24 illustrates a structure of a NAND cell unit according to an embodiment of the invention.

An N-type well region 41b and a P-type well region 41c are formed in a P-type semiconductor substrate 41a. The NAND cell unit of the embodiment is formed in the P-type well region 41c.

The NAND cell unit includes a NAND string in which plural memory cells MC are connected in series and two select gate transistors ST each of which is connected to each end of the NAND string.

The memory cell MC and the select gate transistor ST have the identical structure. Specifically, each of the memory cell MC and the select gate transistor ST includes the N-type diffusion layer 42, the gate insulating layer 43 that is formed on the channel region between the N-type diffusion layers 42, the recording portion (ReRAM) 44 that is formed on the gate insulating layer 43, and the control gate electrode 45 that is formed on the recording portion 44.

The state (insulator/conductor) of the recording portion 44 of the memory cell MC can be changed by the basic operation. On the other hand, the recording portion 44 of the select gate transistor ST is fixed to the setting state, that is, the conductor (small resistance).

One of the select gate transistors ST is connected to the source line SL, and the other is connected to the bit line BL.

It is assumed that all the memory cells in the NAND cell unit are in the resetting state (large resistance) before the setting (write) operation.

The setting (write) operation is performed one by one from the memory cell MC on the side of the source line SL toward the memory cell MC on the side of the bit line BL.

The write potential V1 (positive potential) is provided to the selected word line (control gate electrode) WL, and a transfer potential (potential at which the memory cell MC is turned on) Vpass is provided to the nonselected word line WL.

The select gate transistor ST on the side of the source line SL is turned off, the select gate transistor ST on the side of the bit line BL is turned on, and the program data is transferred from the bit line BL to the channel region of the selected memory cell MC.

For example, when the program data is "1", a write inhibit potential (for example, a potential similar to the potential V1) is transferred to the channel region of the selected memory cell MC such that the resistance value of the recording portion 44 of the selected memory cell MC does not change from the high resistance state to the low resistance state.

When the program data is "0", the potential V2 (<V1) is transferred to the channel region of the selected memory cell MC, and the resistance value of the recording portion 44 of the selected memory cell MC changes from the high resistance state to the low resistance state.

In the resetting (erasing) operation, for example, the potential V1' is provided to all the word lines (control gate electrodes) WL to turn on all the memory cells MC in the NAND cell unit. The two select gate transistors ST are turned on, the potential V3 is provided to the bit line BL, and the potential V4 (<V3) is provided to the source line SL.

At this point, because the hot electrons are injected into the recording portions 44 of all the memory cells MC in the NAND cell unit, the resetting operation is collectively performed to all the memory cells MC in the NAND cell unit.

In the read operation, the read potential (positive potential) is provided to the selected word line (control gate electrode) WL, and a potential is provided to the nonselected word line (control gate electrode) WL such that the memory cell MC is surely turned on irrespective of the pieces of data "0" and "1".

The two select gate transistors ST are turned on to supply the read current to the NAND string.

When the read potential is applied to the selected memory cell MC, because the selected memory cell MC is turned on or off according to the data value stored therein, the data can be read by detecting, for example, the change in the read current.

In the structure of FIG. 23, the select gate transistor ST has the structure identical to that of the memory cell MC. For example, as illustrated in FIG. 24, the recording portion (recording layer) is not formed in the select gate transistor ST, but the select gate transistor ST may be formed by the usual MIS transistor.

Figure 25:
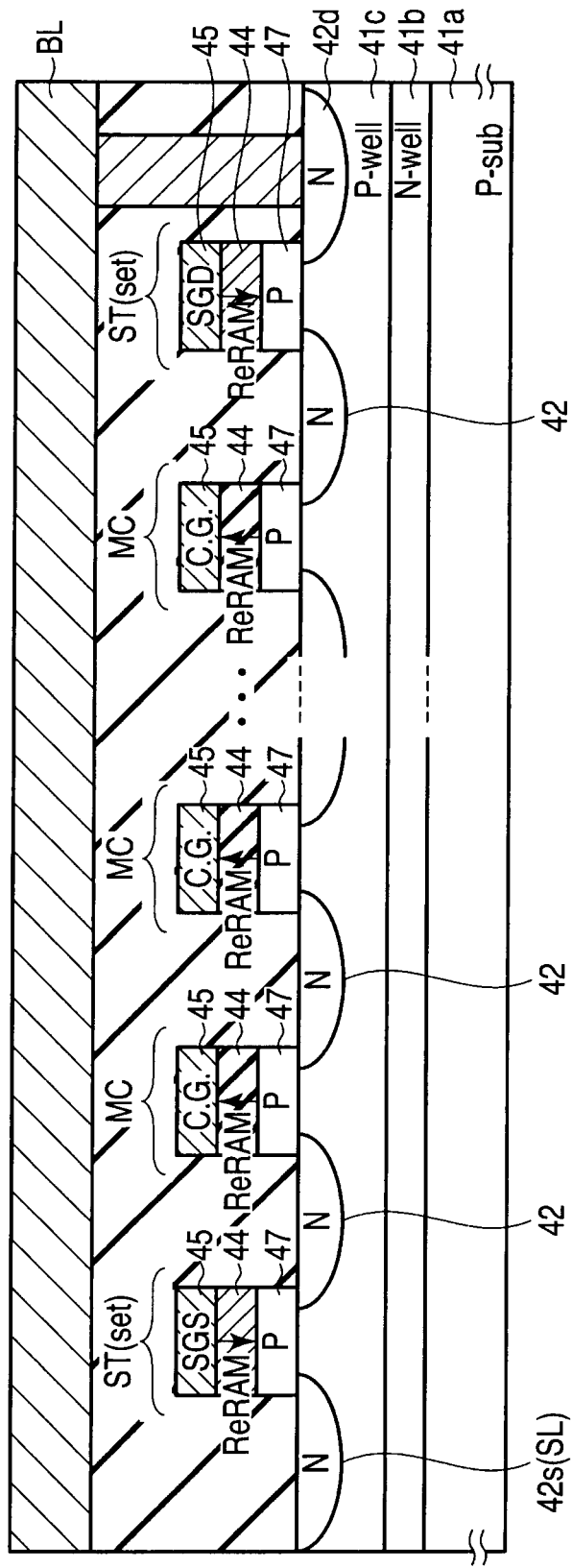

FIG. 25 is a modification example of the NAND type flash memory.

The most distinctive feature of the modification is that the gate insulating layers of the plural memory cells MC constituting the NAND string are replaced by P-type semiconductor layers 47.

When the memory cell MC is more finely formed, in response to the progress in higher integration, the P-type semiconductor layer 47 is filled with a depletion layer in the state in which the voltage is not provided.

During the setting (write), the positive write potential (for example, 3.5 V) is provided to the control gate electrode 45 of the selected memory cell MC, and the positive transfer potential (for example, 1 V) is provided to the control gate electrode 45 of the nonselected memory cell MC.

At this point, the surfaces of the P-type well regions 41c of the plural memory cells MC in the NAND string are inverted from the P-type to the N-type to form the channel.

Therefore, as described above, the select gate transistor ST on the side of the bit line BL is turned on, and the program data "0" is transferred from the bit line BL to the channel region of the selected memory cell MC, which allows the setting operation to be performed.

The negative erasing potential (for example, −3.5 V) is provided to all the control gate electrodes 45, and the ground potential (0 V) is provided to the P-type well region 41c and the P-type semiconductor layer 47, which allows the resetting (erasing) to be collectively performed to all the memory cells MC constituting the NAND string.

During the read, the positive read potential (for example, 0.5 V) is provided to the control gate electrode 45 of the selected memory cell MC, and the transfer potential (for example, 1 V) is provided to the control gate electrode 45 of the nonselected memory cell MC such that the memory cell MC is surely turned on irrespective of the pieces of data "0" and "1".

At this point, it is assumed that a threshold voltage Vth"1" of the memory cell MC in the "1" state is located within a range of 0 V<Vth"1"<0.5 V, and it is assumed that a threshold voltage Vth"0" of the memory cell MC in the "0" state is located within a range of 0.5 V<Vth"0"<1 V.

The two select gate transistors ST are turned on to supply the read current to the NAND string.

Therefore, an amount of current passed through the NAND string changes according to the data value stored in the selected memory cell MC, so that the data can be read by detecting the change in current.

In the modification, preferably a hole-doped amount of the P-type semiconductor layer 47 is larger than that of the P-type well region 41c, and preferably a Fermi level of the P-type semiconductor layer 47 is deeper than that of the P-type well region 41c by about 0.5 V.

This is because the inversion from the P-type to the N-type is started from the surface portion of the P-type well region 41c between the N-type diffusion layers 42 to form the channel when the positive potential is provided to the control gate electrode 45.

Therefore, for example, the channel of the nonselected memory cell MC is formed only at the interface between the P-type well region 41c and the P-type semiconductor layer 47 during the write, and the channels of the plural memory cells MC in the NAND string are formed only at the interfaces between the P-type well regions 41c and the P-type semiconductor layers 47 during the read.

That is, even if the recording portion 44 of the memory cell MC becomes the conductor (setting state), the diffusion layer 42 and the control gate electrode 45 are not short-circuited.

(4) NOR Type Flash Memory

Figure 26:
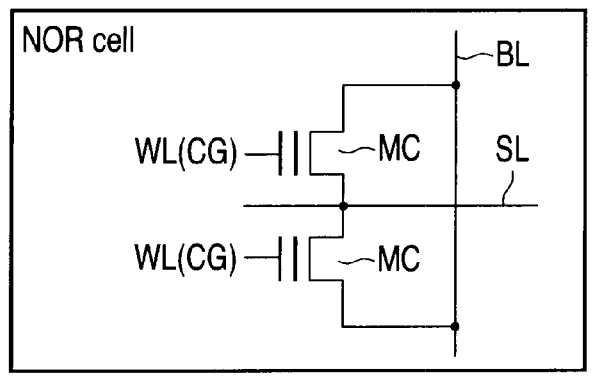
FIG. 26 is a circuit diagram illustrating a NOR cell.
Figure 27:
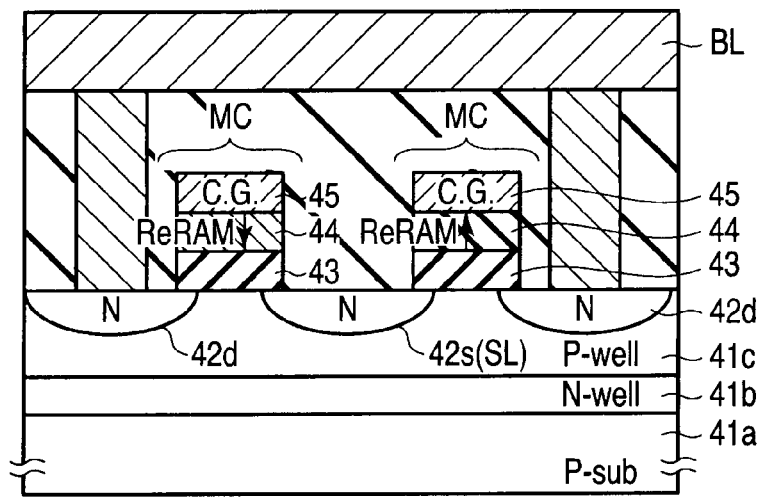
FIG. 27 is a view illustrating a structure of the NOR cell.

FIG. 26 illustrates a circuit diagram of a NOR cell unit. FIG. 27 illustrates a structure of a NOR cell unit according to an embodiment of the invention.

The N-type well region 41b and the P-type well region 41c are formed in the P-type semiconductor substrate 41a. The NOR cell of the embodiment is formed in the P-type well region 41c.

The NOR cell includes one memory cell (MIS transistor) MC that is connected between the bit line BL and the source line SL.

The memory cell MC includes the N-type diffusion layer 42, the gate insulating layer 43 that is formed on the channel region between the N-type diffusion layers 42, the recording portion (ReRAM) 44 that is formed on the gate insulating layer 43, and the control gate electrode 45 that is formed on the recording portion 44.

The state (insulator/conductor) of the recording portion 44 of the memory cell MC can be changed by the basic operation.

(5) Two-Transistor Type Flash Memory

Figure 28:
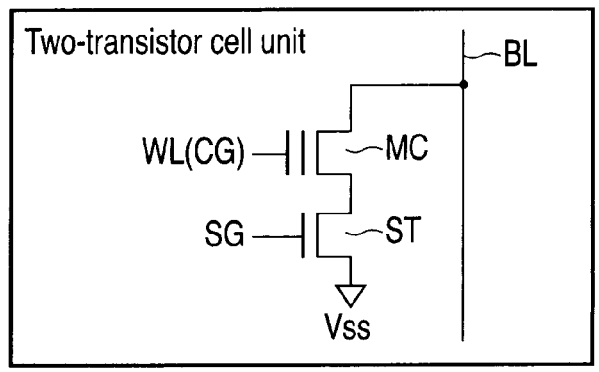
FIG. 28 is a circuit diagram illustrating a two-transistor cell unit.
Figure 29:
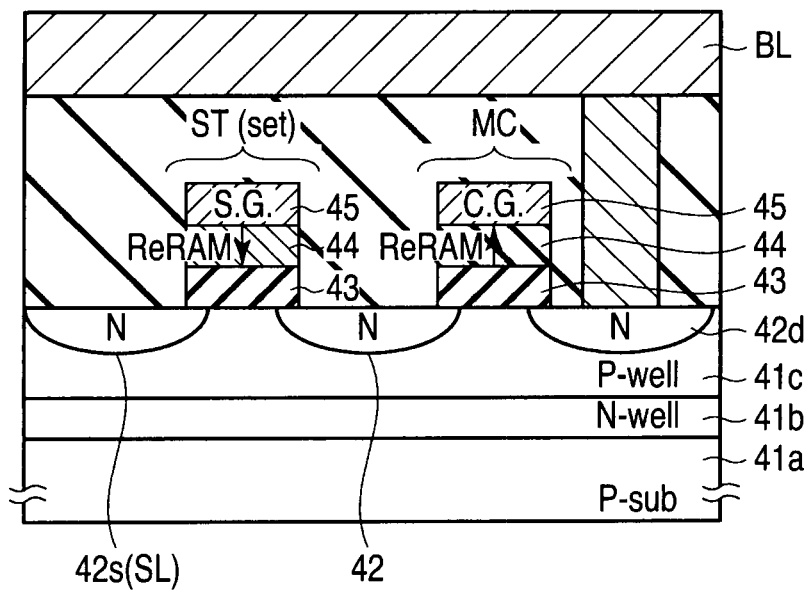
FIGS. 29 and 30 are views, each illustrating a structure of the two-transistor cell unit.

FIG. 28 illustrates a circuit diagram of a two-transistor cell unit. FIG. 29 illustrates a structure of a two-transistor cell unit according to an embodiment of the invention.

Recently, the two-transistor cell unit is developed as the new cell structure having both the features of the NAND cell unit and NOR cell.

The N-type well region 41b and the P-type well region 41c are formed in the P-type semiconductor substrate 41a. The two-transistor cell unit of the embodiment is formed in the P-type well region 41c.

The two-transistor cell unit includes one memory cell MC and one select gate transistor ST, which are connected in series.

The memory cell MC and the select gate transistor ST have the identical structure. Specifically, each of the memory cell MC and the select gate transistor ST includes the N-type diffusion layer 42, the gate insulating layer 43 that is formed on the channel region between the N-type diffusion layers 42, the recording layer (ReRAM) 44 that is formed on the gate insulating layer 43, and the control gate electrode 45 that is formed on the recording portion 44.

The state (insulator/insulator) of the recording portion 44 of the memory cell MC can be changed by the basic operation. On the other hand, the recording portion 44 of the select gate transistor ST is fixed to the setting state, that is, the insulator (small resistance).

The select gate transistor ST is connected to the source line SL, and the memory cell MC is connected to the bit line BL.

The state (insulator/insulator) of the recording portion 44 of the memory cell MC can be changed by the basic operation.

Figure 30:
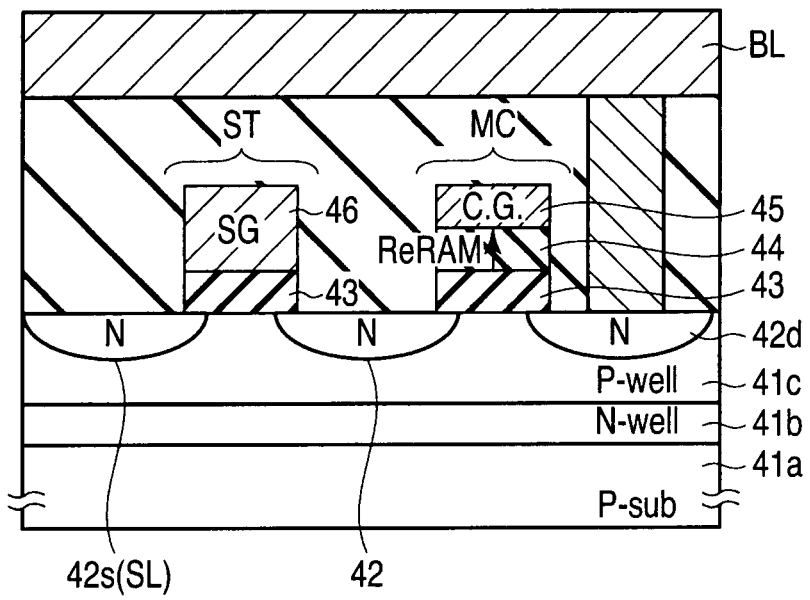

In the structure of FIG. 29, the select gate transistor ST has the structure identical to that of the memory cell MC. However, for example, as illustrated in FIG. 30, the recording portion (recording layer) is not formed in the select gate transistor ST, but the select gate transistor ST may be formed by the usual MIS transistor.

6. Conclusion

According to the invention, the high-recording-density, low-power-consumption, nonvolatile information recording and reproducing device can be implemented.

The information recording and reproducing device according to the embodiment of the invention, irrespective of its extremely simple structure, can realize a high-speed operation while the information recording can be performed with a recording density that cannot be attained by the conventional technology. The invention has a huge industrial merit as a next-generation technology that breaks through the recording density barrier associated with the current nonvolatile memory.

The invention is not limited to the embodiment, but various modifications of each constituent can be made without departing from the scope of the invention. Various inventions can be made by an appropriate combination of plural constituents disclosed in the embodiments. For example, some constituents may be eliminated from all the constituents disclosed in the embodiments, or constituents of different embodiments may appropriately be combined.

What is claimed is:

1. An information recording and reproducing device comprising:
a recording layer which includes a typical element and a transition element, and stores a state of a first electric resistivity and a state of a second electric resistivity different from the first electric resistivity by a movement of the typical element; and
an electrode layer which is disposed at one end of the recording layer to apply a voltage or a current to the recording layer,
wherein the recording layer includes a first region which is in contact with the electrode layer and the electrode layer includes a second region which is in contact with the recording layer,
the first and second regions are opposite to each other, and
the first and second regions include the typical element, and a concentration of the typical element in the second region is higher than that in the first region.

2. The device of claim 1, wherein a composition of the first region is different from that of other regions in the recording layer excluding the first region, and the first region includes the typical element, and a concentration of the typical element in the first region is higher than that in the other regions.

3. The device of claim 1, wherein the typical element is an element which is selected from a group of Zn, Cd, Hg, Al, Ga, In, Ti, Be, Mg, and Ca.

4. The device of claim 1, wherein the electrode layer includes an element which is selected from a group of Ti, Zr, Hf, V, Nb, Ta, Cr, Mo, W, Ru, Ni, Pd, Pt, Cu, Ag, and Au.

5. The device of claim 1, wherein the electrode layer has a thickness of 20 nm or less.

6. The device of claim 1, wherein the recording layer includes a material expressed by a chemical formula: $A_xM_yX_4$ ($0.1 \leq x \leq 2.2$, $1.5 \leq y \leq 2$), where A is a transition element which is selected from a group of Zn, Cd, and Hg, M is a transition element which is selected from a group of Cu, Mo, W, Mn, Tc, Re, and Fe, and X is an element which is selected from a group of O and N.

7. The device of claim 1, wherein the recording layer includes a crystal structure which is selected from a group of a spinel structure, an ilmenite structure, a wolframite structure, and a delafossite structure.

8. The device of claim 1, wherein the recording layer has a thickness of 50 nm or less.

9. The device of claim 1, wherein the electrode layer is disposed on a semiconductor chip, the recording layer is disposed on the electrode layer, and a probe is disposed on the recording layer, whereby the voltage or the current is applied between the probe and the electrode layer to change the state of the recording layer.

10. The device of claim 1, wherein a first conductive line extending in a first direction is disposed at an end of the recording layer, the electrode layer is a second conductive line extending in a second direction being cross to the first direction, and the voltage or the current is applied between the first and second conductive lines to change the state of the recording layer.

* * * * *